(12) United States Patent
Weissman et al.

(10) Patent No.: US 9,356,632 B2
(45) Date of Patent: May 31, 2016

(54) INTERMODULATION DISTORTION CANCELLER FOR USE IN MULTI-CARRIER TRANSMITTERS

(71) Applicant: QUALCOMM Incorporated, San Diego, CA (US)

(72) Inventors: Haim Mendel Weissman, Haifa (IL); Rimon Mansour, Nazareth (IL); James Ian Jaffee, Solana Beach, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 56 days.

(21) Appl. No.: 14/508,902

(22) Filed: Oct. 7, 2014

(65) Prior Publication Data
US 2016/0099733 A1 Apr. 7, 2016

(51) Int. Cl.
*H04B 1/10* (2006.01)
*H04B 1/04* (2006.01)

(52) U.S. Cl.
CPC .................... *H04B 1/0475* (2013.01)

(58) Field of Classification Search
CPC ...... H04B 1/525; H04B 1/3805; H04B 1/406; H04W 5/0018; H04W 52/367; G06K 7/0008; G06K 7/10039
See application file for complete search history.

(56) References Cited

U.S. PATENT DOCUMENTS

| | | | |
|---|---|---|---|
| 8,135,348 B2 | 3/2012 | Aparin | |
| 8,170,487 B2 * | 5/2012 | Sahota | H04B 1/525 455/296 |
| 8,660,041 B2 | 2/2014 | Niskanen et al. | |
| 9,231,801 B2 | 1/2016 | Rimini et al. | |
| 2004/0106381 A1 | 6/2004 | Tiller | |
| 2005/0107051 A1 * | 5/2005 | Aparin | H04B 1/525 455/126 |
| 2006/0252398 A1 * | 11/2006 | Park | H04B 1/525 455/296 |
| 2009/0196373 A1 * | 8/2009 | Snook | H06K 7/0008 375/269 |
| 2010/0039965 A1 | 2/2010 | Yamazaki | |
| 2012/0112956 A1 | 5/2012 | Trotta et al. | |
| 2013/0044621 A1 | 2/2013 | Jung et al. | |
| 2014/0011461 A1 * | 1/2014 | Bakalski | H04B 1/3805 455/78 |
| 2014/0051373 A1 | 2/2014 | Klomsdorf et al. | |

FOREIGN PATENT DOCUMENTS

EP 2704318 A1 3/2014

OTHER PUBLICATIONS

International Search Report and Written Opinion—PCT/US2015/054032—ISA/EPO—Dec. 11, 2015.

\* cited by examiner

*Primary Examiner* — Thanh Le
(74) *Attorney, Agent, or Firm* — Procopio, Cory, Hargreaves & Savitch, LLP

(57) ABSTRACT

An intermodulation distortion canceller for use in multi-carrier transmitters is disclosed. In an exemplary embodiment, an apparatus includes a first transmit chain that transmits a first RF signal, a second transmit chain that transmits a second RF signal, and a canceller that outputs a first leakage cancellation signal that is input to the second transmit chain, and outputs a second leakage cancellation signal that is input to the first transmit chain, the canceller generates the first and second leakage cancellation signals from the first and second RF signals or from first and second baseband signals used to generate the first and second RF signals.

20 Claims, 18 Drawing Sheets

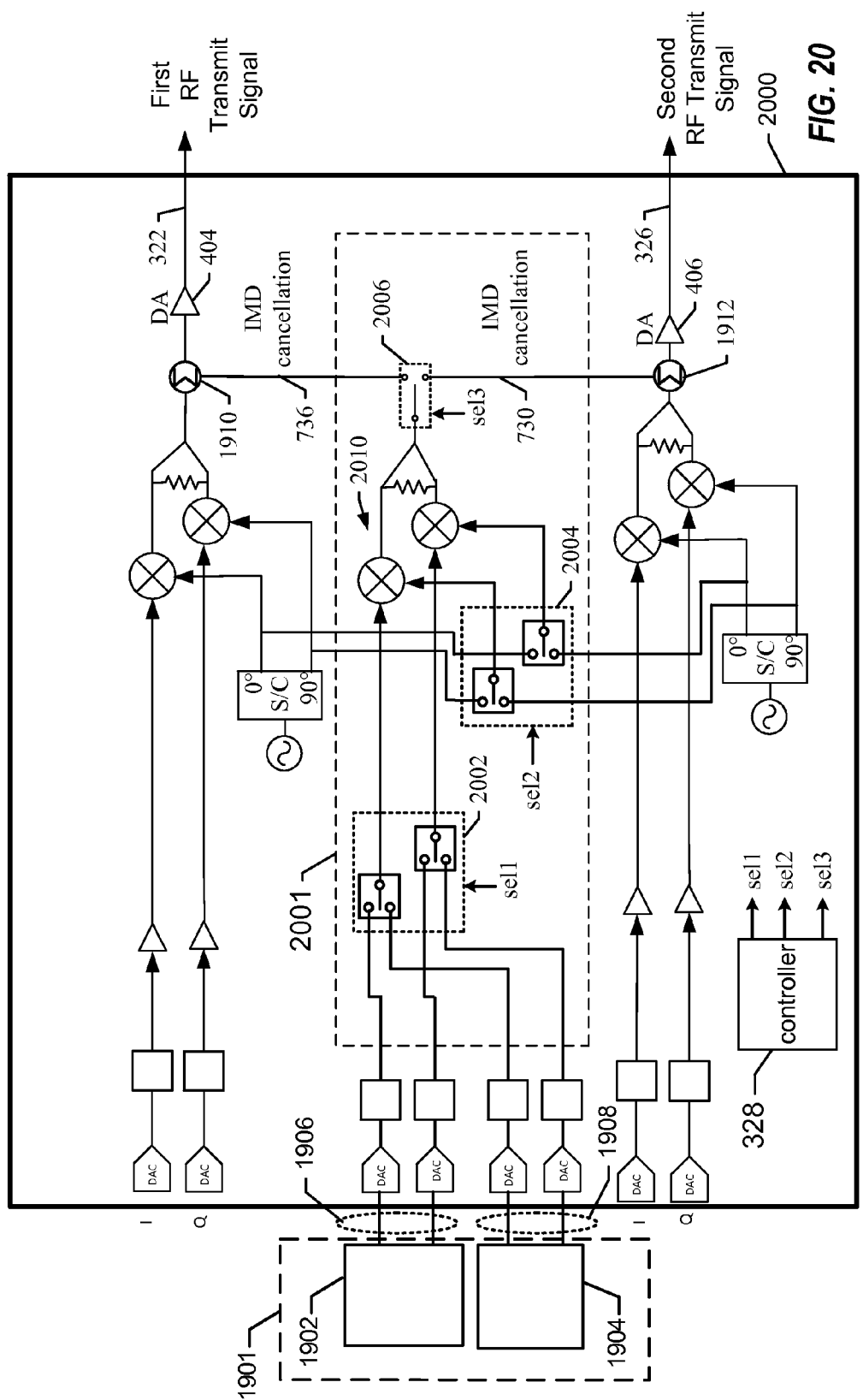

INTERMODULATION DISTORTION CANCELLER FOR USE IN MULTI-CARRIER TRANSMITTERS

BACKGROUND

I. Field

The present disclosure relates generally to electronics, and more specifically to multi-carrier transmitters.

II. Background

A wireless device (e.g., a cellular phone or a smartphone) in a wireless communication system may transmit and receive data for two-way communication. For example, the wireless device may operate in a frequency division duplexing (FDD) system or in a time division duplexing system (TDD). The wireless device may include a transmitter for data transmission and a receiver for data reception. For data transmission, the transmitter may modulate a radio frequency (RF) carrier signal with data to obtain a modulated RF signal, amplify and filter the modulated RF signal to obtain an amplified RF signal having the proper output power level, and transmit the amplified RF signal via an antenna to a base station. For data reception, the receiver may obtain a received RF signal via the antenna and may amplify, filter and process the received RF signal to recover data sent by the base station.

A wireless device may support operation over a wide frequency range. The wireless device may include a number of amplifiers, with each amplifier being designed to operate over a portion of the wide frequency range supported by the wireless device. For example, the wireless device may operate in a carrier aggregation (CA) communication system in which the device comprises multiple uplink (UL) transmitters transmitting at different carrier frequencies. However, simultaneous transmission by the transmitters might cause receiver desensitization due to intermodulation distortion (IMD).

Therefore, it is desirable to have a distortion canceller for use in a wireless device to support operation over a wide frequency range while reducing intermodulation distortion.

BRIEF DESCRIPTION OF THE DRAWINGS

FIG. 2 shows exemplary frequency band groups in which the IMD canceller of

FIG. 1 is configured to operate.

FIG. 20 shows a modified baseband to RF converter comprising an exemplary alternative embodiment of an IMD canceller for use in a wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
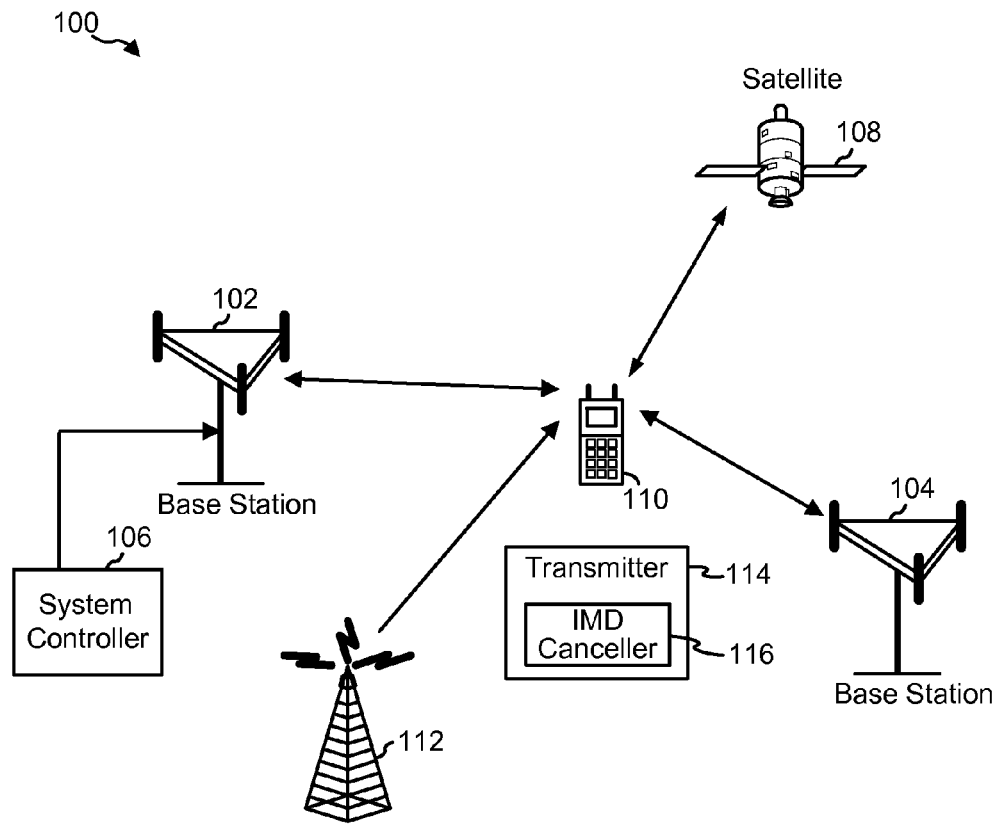
FIG. 1 shows an exemplary embodiment of an IMD canceller in a wireless device configured to communicate in a wireless communication system.

FIG. 1 shows an exemplary embodiment of an IMD canceller 116 in a wireless device 110 configured to communicate in a wireless communication system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows the wireless device 110 in communication with base stations 102 and 104 and one system controller 106. In general, the wireless communication system 100 may include any number of base stations, Femto cells, Pico cells and/or any set of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may also receive signals from broadcast stations (e.g., a broadcast station 112), and/or signals from satellites (e.g., a satellite 108) in one or more global navigation satellite systems (GNSS). Wireless device 110 may support one or more radio technologies for wireless communication such as LTE, WCDMA, CDMA 1X, EVDO, TD-SCDMA, GSM, 802.11.

Wireless device 110 includes a transmitter 114 having an exemplary embodiment of the IMD canceller 116. The transmitter 114 includes multiple transmit circuits that are configured to transmit over multiple transmit frequencies. Cross-leakage between two power amplifiers (PAs) may result in Tx intermodulation products IMD2, IMD3, IMD4, and/or IMD5, which might fall within the downlink (DL) frequency of one or both of the two operational bands. In various exemplary embodiments, the IMD canceller 116 comprises a first adaptive canceller coupled from band-1 to band-2 to cancel any band-1 leaking products at the input of the band-2 PA. The IMD canceller also comprises a second adaptive canceller coupled from band-2 to band-1 to cancel any band-2 leaking products at the input of the band-1 PA. In an exemplary embodiment, PA output detectors are utilized to obtain the level of the leaking signals so that they can be canceled to optimize performance (EVM, BER, etc.). Thus, by adjusting the IMD canceller 116 it is possible to obtain minimal or reduced IMD leading to lower EVM and BER. In exemplary embodiments, the IMD canceller 116 operates to reduce, minimize, or eliminate distortion associated with operation of the multiple simultaneous transmit circuits.

Figure 2:
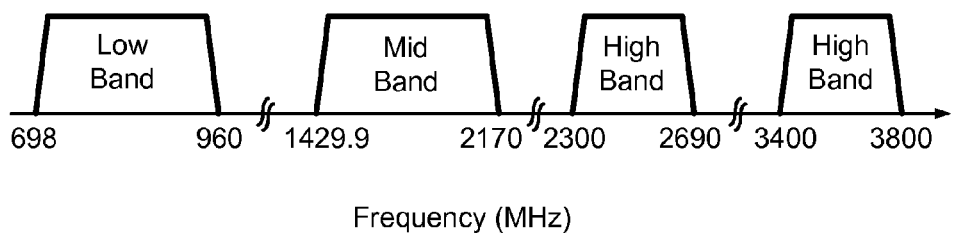

FIG. 2 shows exemplary frequency band groups in which the IMD canceller 116 of FIG. 1 is configured to operate. Wireless device 110 may be able to operate in a low-band (LB) covering frequencies lower than approximately 1000 megahertz (MHz), a mid-band (MB) covering frequencies from approximately 1000 MHz to 2300 MHz, and/or a high-band (HB) covering frequencies higher than 2300 MHz. For example, the low-band may cover 698 to 960 MHz, the mid-band may cover 1427.9 to 2170 MHz, and the high-band may cover 2300 to 2690 MHz and 3400 to 3800 MHz, as shown in FIG. 2. The low-band, mid-band, and high-band refer to three groups of bands (or band groups), with each band group including any number of frequency bands (or simply, "bands"). Each band may cover up to 200 MHz. LTE Release 11 supports 35 bands, which are referred to as LTE/UMTS bands and are listed in 3GPP TS 36.101.

In general, any number of band groups may be defined. Each band group may cover any range of frequencies, which may or may not match any of the frequency ranges shown in FIG. 2. Each band group may also include any number of bands.

Figure 3:
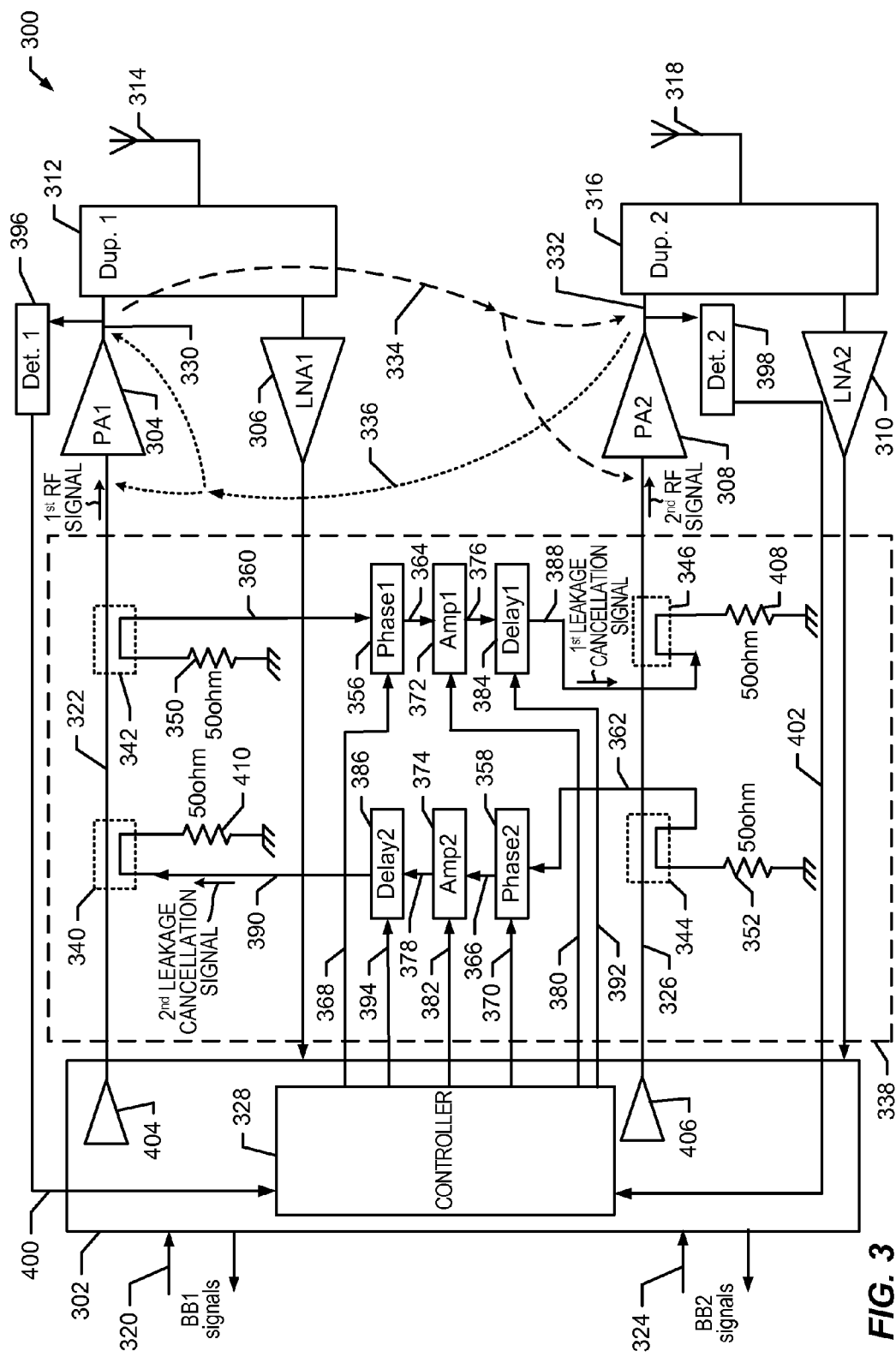
FIG. 3 shows a transmitter that includes an exemplary embodiment of an IMD canceller for use in a wireless device.

FIG. 3 shows a transmitter 300 that includes an exemplary embodiment of an IMD canceller 338 for use in a wireless device, such as the wireless device 110 shown in FIG. 1. The transmitter 300 comprises a baseband (BB) to radio frequency (RF) converter 302, a first power amplifier (PA1) 304, a first low noise amplifier (LNA1) 306, a second power amplifier (PA2) 308, and a second low noise amplifier (LNA2) 310. PA1 304 and LNA1 306 transmit and receive RF signals in a first band through first duplexer 312 using first antenna 314. PA2 308 and LNA2 310 transmit and receive RF signals in a second band through second duplexer 316 using second antenna 318. It should be noted that the first and second bands may be any of the bands shown in FIG. 2. For example, in a first exemplary embodiment, the first band is the high band and the second band is the low band. In a second exemplary embodiment, the first band is the mid band and the second band is the low band. In a third exemplary embodiment, the first band is the mid band and the second band is the low band.

During operation, the baseband to RF converter 302 operates to receive a first baseband transmit signal 320 and converts this signal to a first RF transmit signal 322 that is output from a first driver amplifier (DA) 404. The baseband to RF converter 302 also receives a second BB transmit signal 324 and converts this signal to a second RF transmit signal 326 that is output from a second DA 406. A controller 328 controls the operation of the baseband to RF converter 302 to convert the BB signals to RF signals. A first transmit chain comprises the DA 404, PA1 304, and duplexer 312 and operates to transmit the first baseband signal 320 from the antenna 314. A second transmit chain comprises the DA 406, PA1 308, and duplexer 316 and operates to transmit the baseband signal 324 from the antenna 318.

The first RF transmit signal 322 is input to PA1 304 for amplification to generate a first amplified RF transmit signal 330 that is input to the first duplexer 312 and thereafter transmitted by the first antenna 314. The second RF transmit signal 326 is input to PA2 308 for amplification to generate a second amplified RF transmit signal 332 that is input to the second duplexer 316 and thereafter transmitted by the second antenna 318.

Intermodulation distortion occurs when two transmit (Tx) channels transmit signals simultaneously and one transmit signal couples into another transmit signal. This coupling may appear as distortion in a receive signal band that results in degraded receiver performance. For example, the first amplified RF transmit signal 330 may couple (or leak) to the input or output of PA2 308, as shown by path 334. As a result, an IMD product frequency may fall in the Rx2 range and this IMD product may leak into the Rx2 signal path and be amplified by LNA2 310, thereby degrading the second receiver performance. The second amplified RF transmit signal 332 may couple (or leak) to the input or output of PA1 304, as shown by path 336. As a result an IMD product frequency may fall in the Rx1 range and this IMD product may leak into the Rx1 path and be amplified by LNA1 306, thereby degrading the first receiver performance.

The transmitter 300 also comprises distortion canceller 338, which operates to reduce, minimize, or eliminate distortion caused by leakage of the first amplified RF signal 330 to PA2 308 or leakage of the second amplified RF signal 332 to PA1 304. The canceller 338 comprises signal couplers 342 and 344, which are coupled to the signal lines carrying the first RF signal 322 and the second RF signal 326, respectively. The couplers 342 and 344 comprise any suitable type of signal couplers (directional or non-directional) and have first terminals connected to a signal ground via resistors 350 and 352, respectively. The coupler 342 has a second terminal connected to a first phase adjustment circuit 356 and the coupler 344 has a second terminal connected to a second phase adjustment circuit 358. The couplers 342 and 344 operate to generate coupled signals 360 and 362 from the first and second RF signals 322 and 326 and these coupled signals are input to the first and second phase adjustment circuits 356 and 358, respectively. For example, the coupled signals 360 and 362 represent versions of the first and second RF signals 322 and 326.

The phase adjustment circuits 356 and 358 operate to adjust phase characteristics of the coupled signals 360 and 362 that are receive from the couplers 342 and 344 to generate phase adjusted signals 364 and 366. The phase adjustment circuits 356 and 358 comprise any suitable type of phase adjustment circuits operable to adjust phase characteristics of a received signal based on a control input to generate a phase adjusted output signal. The phase adjustments circuits 356 and 358 operate to adjust the phase characteristics of the coupled signals 360 and 362 based on phase control inputs 368 and 370 received from the controller 328 to generate phase adjusted output signals 364 and 366. The phase adjusted output signals 364 and 366 are input to amplitude adjustment circuits 372 and 374.

The amplitude adjustment circuits 372 and 374 operate to adjust amplitude characteristics of the phase adjusted signals 364 and 366 received from the phase adjustment circuits 356 and 358 to generate amplitude adjusted signals 376 and 378. The amplitude adjustment circuits 372 and 374 comprise any suitable amplitude adjustment circuit operable to adjust amplitude characteristics of a received signal based on a control input to generate an amplitude adjusted output signal. The amplitude adjustment circuits 372 and 374 operate to adjust the amplitude characteristics of the phase adjusted signals 364 and 366 based on amplitude control inputs 380 and 382 received from the controller 328 to generate the amplitude adjusted output signals 376 and 378. The amplitude adjusted output signals 376 and 378 are input to delay adjustment circuits 384 and 386.

The delay adjustment circuits 384 and 386 operate to adjust delay characteristics of the amplitude adjusted signals 376 and 378 received from the amplitude adjustment circuits 372 and 374 to generate first and second cancellation signals 388 and 390. The delay adjustment circuits 384 and 386 comprise any suitable delay adjustment circuit operable to adjust delay characteristics of a received signal based on a control input to generate a delay adjusted output signal. The delay adjustment circuits 384 and 386 operate to adjust the delay characteristics of the amplitude adjusted signals 376 and 378 based on delay control inputs 392 and 394 received from the controller 328 to generate the first and second cancellation signals 388 and 390. The first and second cancellation signals 388 and 390 are input to couplers 346 and 340.

The couplers 346 and 340 have first terminals coupled to a signal ground through resistors 408 and 410. The couplers have second terminals coupled to receive the first and second cancellation signals 388 and 390 and operate to couple the first 388 and second 390 cancellation signals to the signal lines carrying the second 326 and first 322 RF transmit signals, respectively, to cancel distortion caused by leakage of the first amplified RF transmit signal 330 to PA2 308 and leakage of the second amplified RF transmit signal 332 to PA1 304. It should be noted that the arrangement and/or order of the phase, amplitude, and delay adjustment circuits can be changed or rearranged such that other configurations are possible within the scope of the exemplary embodiments.

As described in greater detail below, calibration operations are performed to determine an amount of leakage associated with the path 334 to control the cancellation circuit 338 to generate the first cancellation signal 388 to cancel this leakage at the input of PA2 308. In an exemplary embodiment, a second detector 398 operates to detect a power level at the output of PA2 308 and provides a second detected power level 402 to the controller 328. The controller 328 uses the second detected power level 402 to adjust the cancellation circuit 338 to generate the first cancellation signal 388 so as to cancel detected leakage. Additionally, the calibration operations operate to determine an amount of leakage associated with the path 336 to control the cancellation circuit 338 to generate the second cancellation signal 390 to cancel leakage due to path 336 at the input of PA1 304. In an exemplary embodiment, a first detector 396 operates to detect a power level at the output of PA1 304 and provides a first detected power level 400 to the controller 328. The controller uses the first detected power level 400 to adjust the cancellation circuit 338 to generate the second cancellation signal 390. Once the calibration operations are performed, the cancellation circuit 338 operates to maintain the first 388 and second 390 cancellation signals to cancel leakage during operation of the transceiver.

Figure 4:
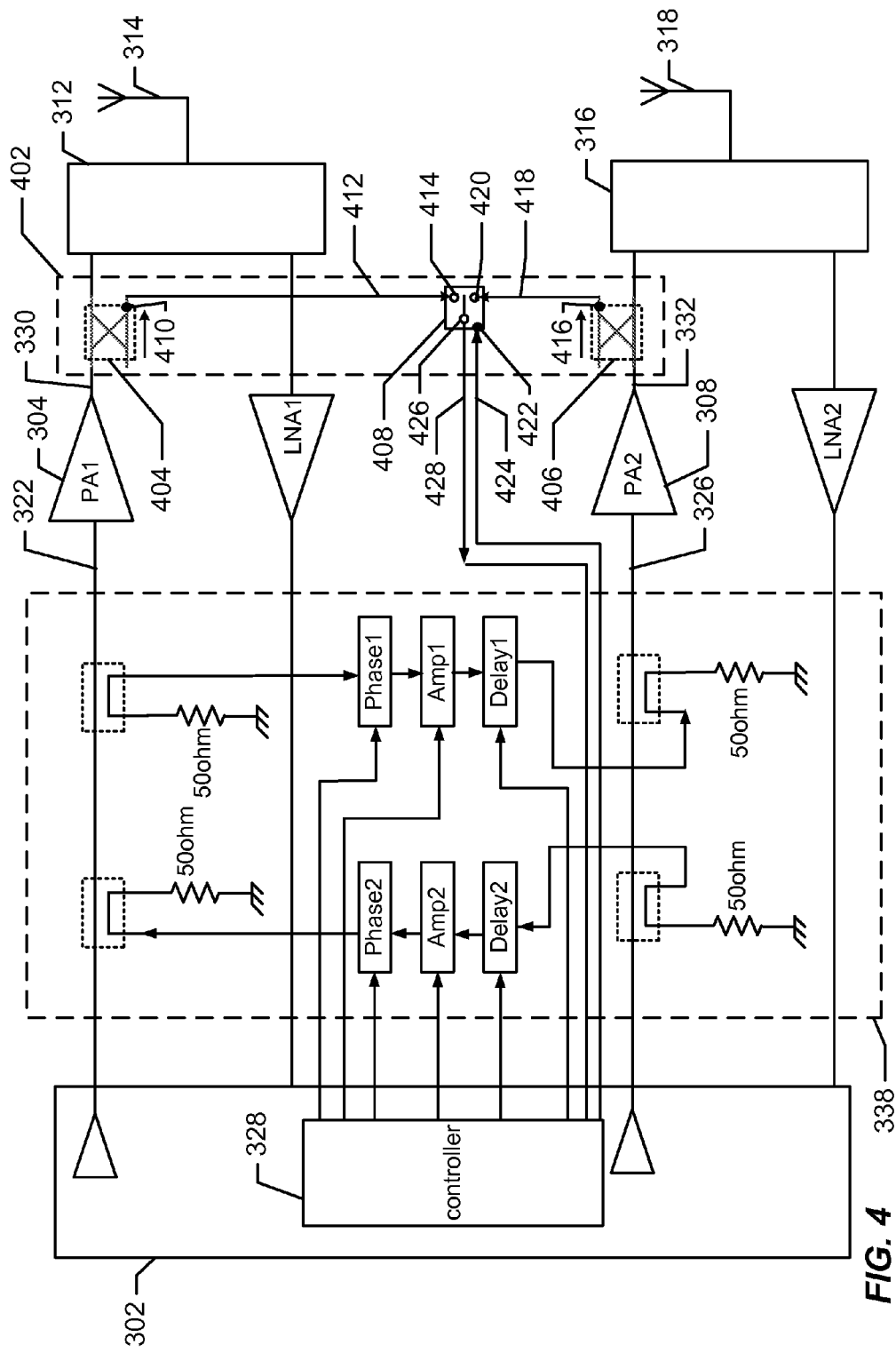
FIG. 4 shows a transmitter that includes an exemplary alternative embodiment of the IMD canceller of FIG. 3 for use in a wireless device.

FIG. 4 shows a transmitter that includes an exemplary alternative embodiment of the IMD canceller of FIG. 3 for use in a wireless device. In this exemplary alternative embodiment, the detectors 396 and 398 shown in FIG. 3 are replaced with a coupler module 402. The coupler module 402 comprises a first directional coupler 404, a second directional coupler 406, and a switch 408. The directional couplers 404, 406 are configured to generate a coupled signal that represents a version of signals flowing in a selected direction in a coupled signal line and to output the coupled signal at an output terminal. Signals flowing in a direction other than the selected direction are suppressed from appearing in the coupled signal.

The first directional coupler 404 is coupled to the signal line carrying the first amplified RF signal 330 between the output of PA1 304 and the first duplexer 312. The second directional coupler 406 is coupled to the signal line carrying the second amplified RF transmit signal 332 between the output of PA2 308 and the second duplexer 316.

The first directional coupler 404 has an output terminal 410 that outputs a first coupled signal 412 that is input to the switch 408 at a first switch terminal 414. The second directional coupler 406 has an output terminal 416 that outputs a second coupled signal 418 that is input to the switch 408 at a second switch terminal 420.

The switch 408 includes a switch control terminal 422 that receives a switch control signal 424 to determine which of the first 414 and second 420 switch terminals will be connected to a switch output terminal 426. The switch output terminal 426 and the switch control terminal 422 are connected to the controller 328 by signal lines 428 and 424.

During operation, the controller 328 outputs the switch control signal on the signal line 424 to control the switch 408 to connect the switch output terminal 426 to one of the switch input terminals 414, 420. Based on the selected terminal, one of the first 412 and second 418 coupled signals is passed to the controller 328 by the signal line 428. Once received at the controller 328, the selected coupled signal is used during the cancellation calibration operations. For example, the coupled signals are used by the controller 328 to adjust the components of the IMD canceller 338 to reduce or eliminate IMD distortion between the first and second transmit chains.

Figure 5:
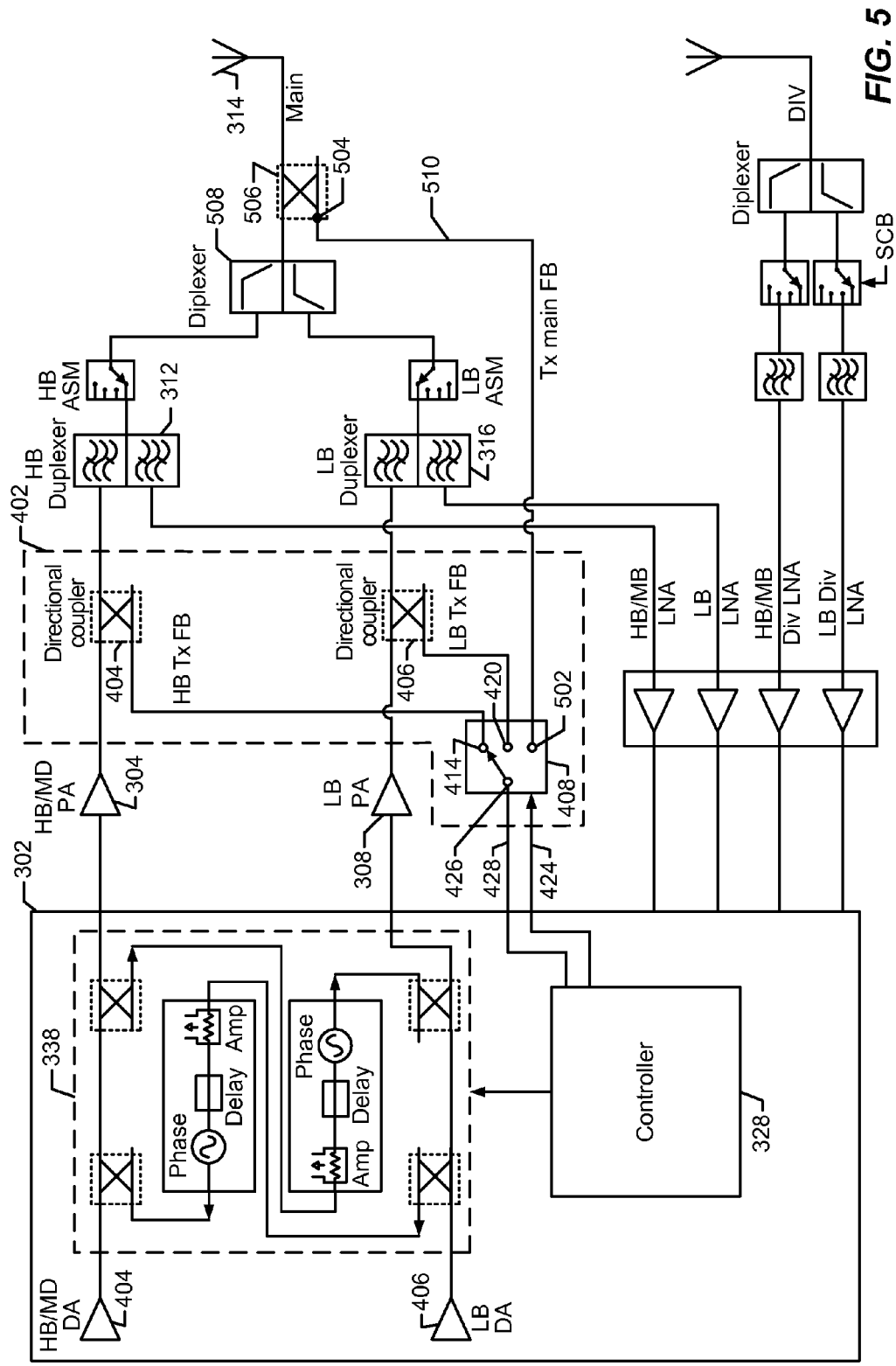
FIG. 5 shows a transmitter that includes an exemplary alternative embodiment of the IMD canceller of FIG. 3 for use in a wireless device.

FIG. 5 shows a transmitter that includes an exemplary alternative embodiment of the IMD canceller of FIG. 3 for use in a wireless device. In this exemplary alternative embodiment, the canceller 338 is moved and integrated within the integrated circuit (IC) of the BB to RF converter 302. By integrating the canceller 338 within the IC of the BB to RF converter 302, circuit board area is saved.

The switch 408 of the coupler module 402 is also modified to include an additional input terminal 502. The input terminal 502 is connected to an output terminal 504 of a directional coupler 506. The directional coupler 506 is coupled to the signal line between a diplexer 508 and the antenna 314. The directional coupler 506 outputs from the output terminal 504 a coupled signal on the signal line 510 that represents a coupled version of the signal to be transmitted from the antenna 314. This signal is referred to as a Tx main feedback signal.

The controller 328 operates to control the switch 408 through switch control line 424 to connect its output terminal 426 to one of its input terminals 414, 420, or 502 so that the coupled signal on the selected input terminal flows to the controller 328 through the signal line 428. Thus, the controller 328 can receive any of the coupled signals generated by the couplers 404, 406, and 506. These coupled signals are used by the controller 328 to perform distortion cancellation operations.

Figure 6:
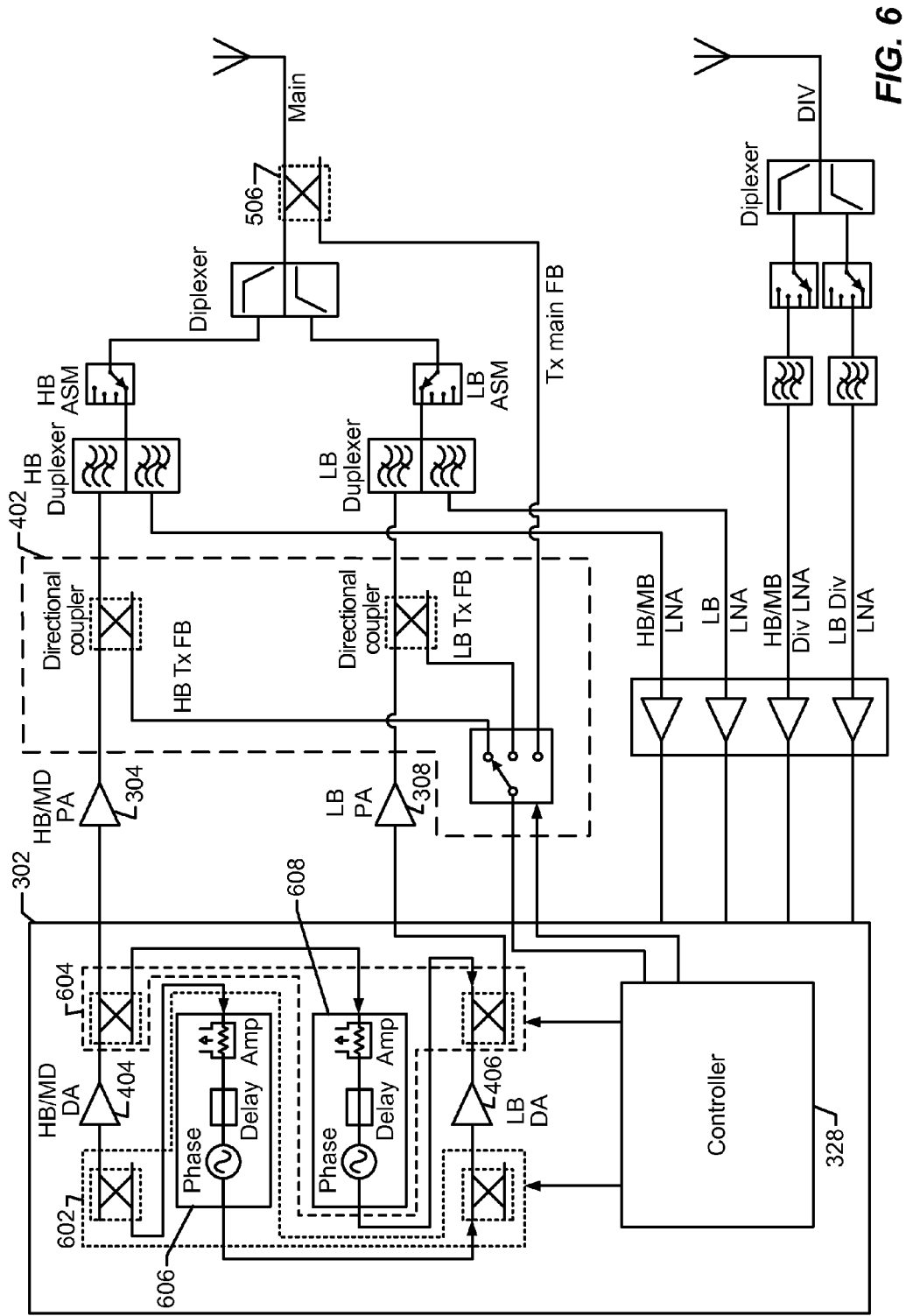
FIG. 6 shows a transmitter that includes an exemplary alternative embodiment of the IMD canceller of FIG. 3 for use in a wireless device.

FIG. 6 shows a transmitter that includes an exemplary alternative embodiment of the IMD canceller of FIG. 3 for use in a wireless device. In this exemplary alternative embodiment, the canceller 338 is moved and integrated within the BB to RF converter 302 and the canceller 338 is split such that a first canceller portion 602 is coupled to inputs of the DAs 404, 406, and a second canceller portion 604 is coupled to outputs of the DAs 404, 406. It should be noted that the components of the canceller portions are the same as those of the canceller 338 shown in FIG. 3, and these canceller portions operate under the control of the controller 328.

The first canceller portion 602 provides an IMD cancellation path at the inputs to the DAs 404 and 406. For example, a coupled version of the signal at the input to the DA 404 is input to the adjustment circuit 606 and the output of the adjustment circuit 606 is coupled to the input of the DA 406. It should be noted that for clarity only one cancellation path is shown connected to the inputs of the DAs 404, 406. There is also another path (not shown) that couples a version of the signal input to the DA 406 through another adjustment circuit (not shown) to the input of the DA 404.

The second canceller portion 604 provides an IMD cancellation path at the inputs to the PAs 304 and 308. For example, a coupled version of the signal at the input to the PA 304 is input to the adjustment circuit 608 and the output of the adjustment circuit 608 is coupled to the input of the PA 308. It should be noted that for clarity only one cancellation path is shown connected to the inputs of the PAs 304, 308. There is also another path (not shown) that couples a version of the signal input to the PA 308 through another adjustment circuit (not shown) to the input of the PA 404.

Thus, multiple versions of the IMD canceller can be used to reduce or elimination IMD either at the inputs to the DAs 404, 406 or the inputs to the PAs 304, 308.

Figure 7:
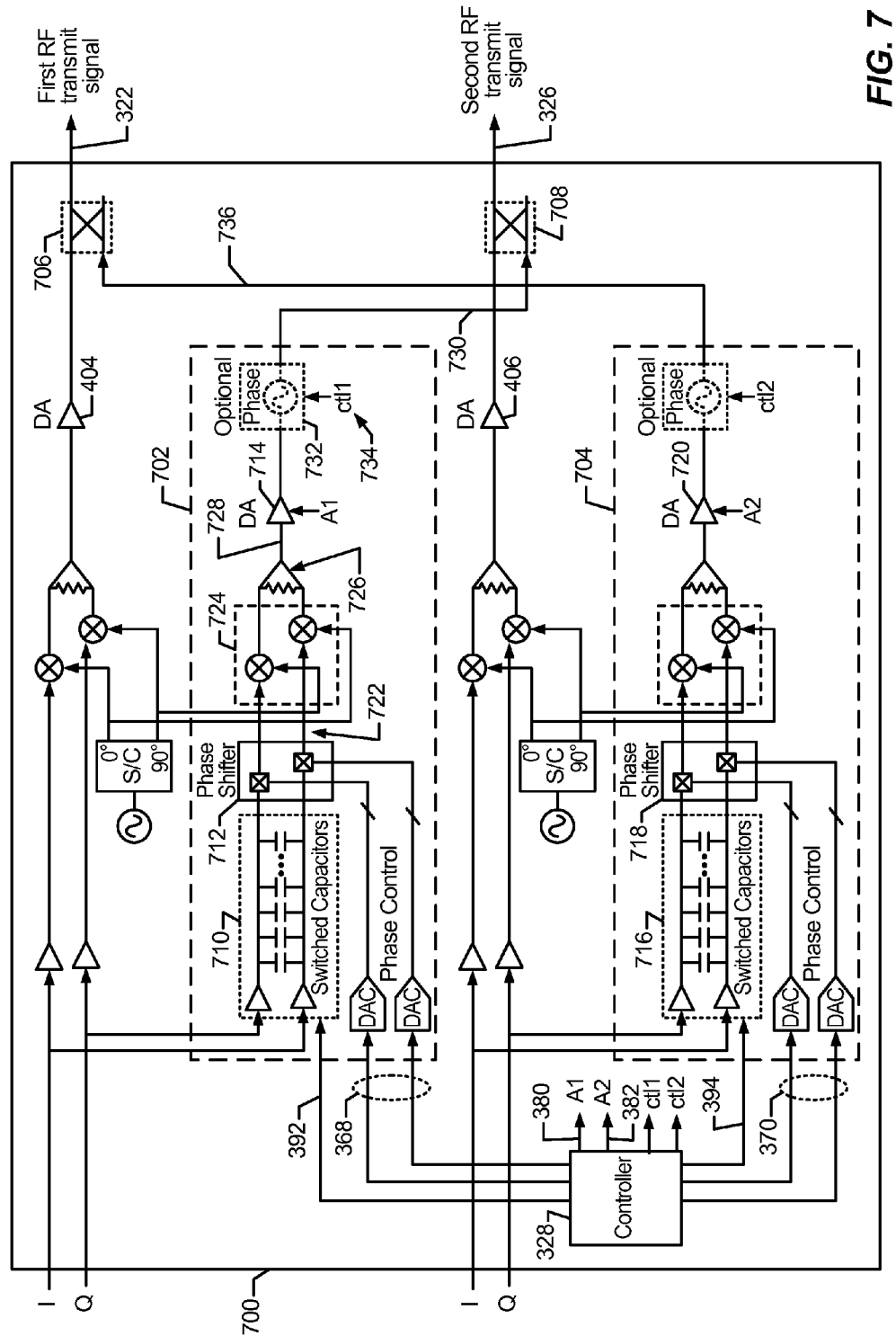
FIG. 7 shows a baseband to RF converter comprising an exemplary embodiment of an IMD canceller for use in a wireless device.

FIG. 7 shows a baseband to RF converter 700 comprising an exemplary embodiment of an IMD canceller for use in a wireless device. In this exemplary embodiment, distortion cancelling signals are generated from received baseband signals and applied to the generated RF signals that are output from the baseband to RF converter 700.

The distortion canceller comprises a first canceller module 702 and a second canceller module 704. The distortion canceller also comprises a first directional coupler 706 and a second directional coupler 708. The first canceller module 702 comprises a first delay circuit 710, a first phase shifter 712, and a first adjustable driver amplifier 714. The second canceller module 704 comprises a second delay circuit 716, a second phase shifter 718, and a second adjustable driver amplifier 720.

The first adjustable delay circuit 710 comprises a switched capacitor delay circuit that operates to receive first baseband signals I and Q and delay these signals by a selectable delay amount determined from a delay control signal on signal line 392 that is generated by the controller 328. Delayed I and Q signals are output from the first adjustable delay circuit 710 and input to the first phase shifter 712. In other exemplary embodiments, the first adjustable delay circuit 710 comprises any other suitable delay circuit to delay the first I and Q signals in response to the delay control signal.

The phase shifter 712 operate to phase shift the delayed signals at its inputs to generate phase shifted signals 722. The amount of phase shift provide by the phase shifter 712 is determined by phase shift control signals on signal lines 368 that are generated by the controller 328.

The phase shifted signals 722, which are still baseband signals, are input to a mixer circuit 724 that includes two mixers to mix the phase shifted signals with local oscillator signals that also are used to modulate the baseband I and Q signals. The RF outputs of the mixer circuit 724 are combined by resistor 726 and the combined signal 728 is input to the driver amplifier (DA) 714. The DA 714 amplifies the signal 728 received at its input and outputs first cancellation signal 730 that is input to directional coupler 708. The amount of amplification provided by the DA 714 is determined by a received amplitude control signal on signal line 380 that is generated by the controller 328. In an exemplary embodiment, an optional phase shifter 732 provides phase shift to the amplified signal 730 that is output from the DA 714 to generate the first cancellation signal 730 that is input to the directional coupler 708.

The phase shifter 732 receives a phase shift control signal on signal line 734 to determine the amount of phase shift to be applied to the output of the DA 730. The phase shift control signal on signal line 734 is generated by the controller 328.

As illustrated in FIG. 7, the second cancellation module 704 is configured similarly to the first cancellation module 702. For example, the second cancellation module 704 comprises the second delay circuit 716, the second phase shifter 718, and the second DA 720, which are all configured to operate as described with reference to their counterparts in the first cancellation module 702. The second cancellation module 704 operates to generate a second cancellation signal 736 that is connected to the first coupler 706.

During operation, the controller 328 uses received feedback signals (not shown in FIG. 7 but shown in FIG. 8) to adjust the cancellation modules 702, 704 to generate the first and second cancellation signals 730, 736. The couplers 706 and 708 operate to couple the first 730 and second 736 cancellation signals to the first and second RF transmit signals that are output from the baseband to RF converter 700. As a result, IMD products between the first and second channels can be reduced, minimized or eliminated. As will be shown in FIG. 8, the controller 328 receives the feedback signals from couplers coupled to RF signals further down the transmit chains.

Figure 8:
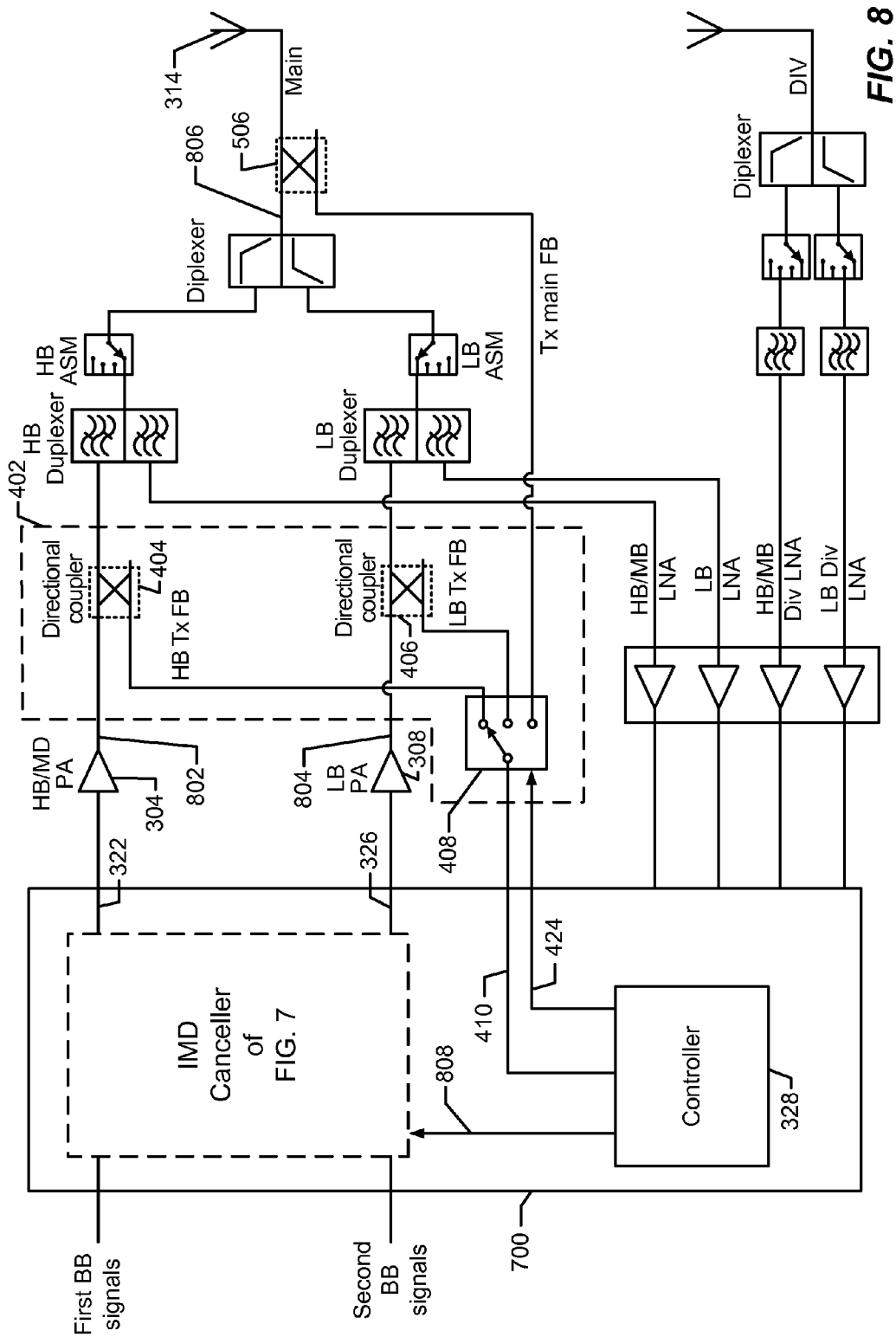
FIG. 8 shows a transmitter that includes an exemplary alternative embodiment of the IMD canceller of FIG. 7 for use in a wireless device.

FIG. 8 shows a transmitter that includes an exemplary alternative embodiment of the IMD canceller of FIG. 7 for use in a wireless device. In this exemplary embodiment, the IMD canceller shown in FIG. 7 is incorporated within the IC of the baseband to RF converter 700. FIG. 8 also shows the generation of the feedback signals used by the controller 328.

As shown in FIG. 8, the coupler circuit 402 operates to provide a feedback signal 410 to the controller 328. The feedback signal is selected from signals input to the switch 408. In an exemplary embodiment, the switch 408 receives a first coupled signal from the directional coupler 404 that is couple to the signal line 802 carrying the first amplified RF transmit signal. The switch 408 also receives a second coupled signal from the directional coupler 406 that is couple to the signal line 804 carrying the second amplified RF transmit signal. The switch 408 also receives a third coupled signal from the directional coupler 506 that is couple to the signal line 806 carrying the signal to be transmitted by the antenna 314. The switch 408 receives a switch control signal on the signal line 424 that controls the switch 408 to connect one of its input terminals to its output terminal. The switch output terminal is connected to the controller 328 by the signal line 410.

The controller 328 also generates the control signals 808 that control the operation of the IMD canceller as discussed in the exemplary embodiments above. Thus, the controller 328 operates to obtain one or more of the coupled signals by controlling the operation of the switch 408. The controller 328 uses the coupled signals to control the operation of the IMD canceller to reduce, minimize, or elimination IM distortion.

Figure 9:
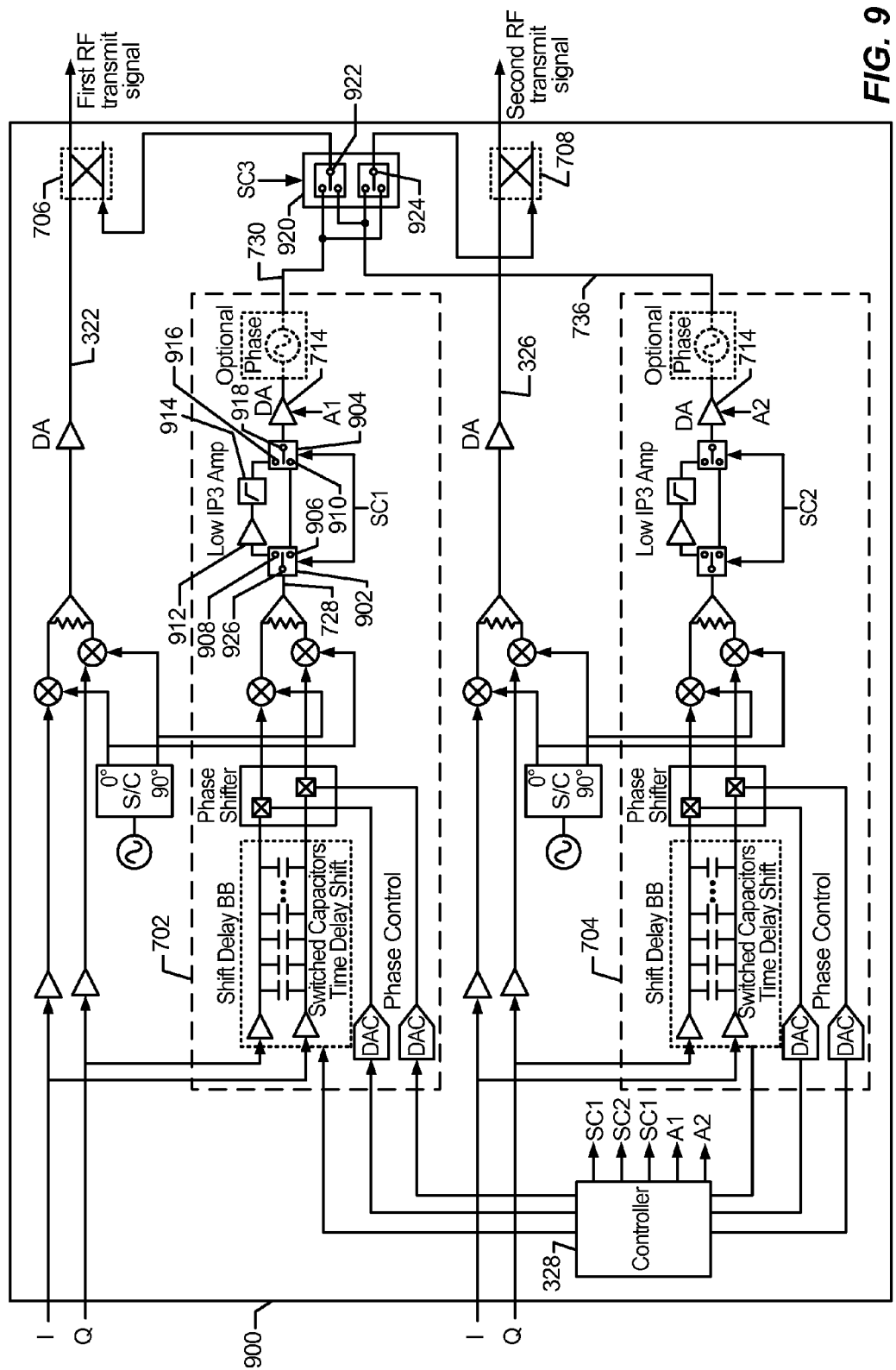
FIG. 9 shows a baseband to RF converter comprising an exemplary alternative embodiment of the IMD canceller of FIG. 7 for use in a wireless device.

FIG. 9 shows a baseband to RF converter 900 comprising an exemplary alternative embodiment of the IMD canceller in FIG. 7 for use in a wireless device. In this embodiment, the canceller modules 702, 704 are modified to generate either IM distortion canceling signals or harmonic canceling signals. To cancel IM distortion, the generated IM distortion canceling signals are cross-coupled to the first and second RF transmit signals 322, 326 using the couplers 706, 708. To cancel harmonic distortion, harmonic distortion canceling signals generated from each canceller module are coupled back to the RF transmit signal used to generate the cancellation signal associated with each canceller module.

In an exemplary embodiment, the first canceller module 702 is modified to include a first switch 902 and a second switch 904. The first switch 902 has an input terminal 926 that is connected to receive the delay and phase adjusted cancellation signal 728. The first switch 902 has a first output terminal 906 and a second output terminal 908. The first output terminal 906 is connected to a first input terminal 910 of the second switch 904. The second output terminal 908 is connected to an input of an amplifier 912. An output of the amplifier 912 is connected to an input of a filter 914. An output of the filter 914 is connected to a second input terminal 916 of the second switch 904. An output terminal 918 of the second switch 904 is connected to an input of the DA 714.

During operation, the first 902 and second 904 switches are controlled by switch control signals (SC1) generated by the controller 328. In a filter bypass mode, the first switch 902 is set so that the input terminal 926 is connected to the first output terminal 906. The second switch 904 is set so that its first input terminal 910 is connected to its output terminal 918. In this mode, the amplifier 912 and filter 914 are bypassed so that the cancellation module 702 operates to generate IM distortion canceling signals at the output of the DA 714 as described with respect to FIG. 7. The second canceller module 704 is configured similarly to the first canceller module 702.

In a non-bypass mode of operation, the first switch 902 is set so that its input terminal 926 is connected to the second output terminal 908. The second switch 904 is set so that the second input terminal 916 is connected to the output terminal 918. In this mode, the amplifier 912 and filter 914 are not bypassed but instead connected to receive the delay and phase adjusted cancellation signal 728 and output an amplified and filtered signal to the input of the DA 714. In this non-bypassed mode, signals to cancel harmonic distortion are generated at the output of the DA 714. For example, the amplifier 912 operates to amplify the delay and phase adjusted cancellation signal 728 and output an amplified signal that is input to the filter 914. In an exemplary embodiment, the amplifier 912 functions as a low IP3 amplifier. The filter 914 operates to filter this amplified signal such that harmonic signals remain that can be canceled from first amplified RF signal 322. The second canceller module 704 is modified to operate the same as the first canceller module 702. Thus, the two canceller modules 702 and 704 operate to generate the canceling signals 730, 736. These canceling signals 730, 736 are generated to be either IM distortion canceling signals or harmonic distortion canceling signals depending on the settings of the switches 902 and 904 in module 702 and similar switches in module 704.

In addition to the modifications to the canceller modules 702, 704, an output switch 920 is added to switch the cancellation signals 730, 736 to the couplers 706, 708 associated with the first 322 and second 326 RF transmit signals.

The output switch 920 is configured as two switches with each switch have two inputs and one output. The output 922 of the first switch is connected to the directional coupler 706 and the output 924 of the second switch is connected to the directional coupler 708. When in by-pass mode, IM distortion cancellation is performed. In this mode, the switch 920 cross couples the cancellation signals 730, 736 to the output couplers 706, 708. When in non-by-pass mode, the switch 920 connects the cancellation signals 730, 736, which represent harmonic cancellation signals, to the coupler associated with its respective transmit signal. For example, the harmonic cancellation signal 730 is connected to the coupler 706, and the harmonic cancellation signal 736 is connected to the coupler 708.

Figure 10:
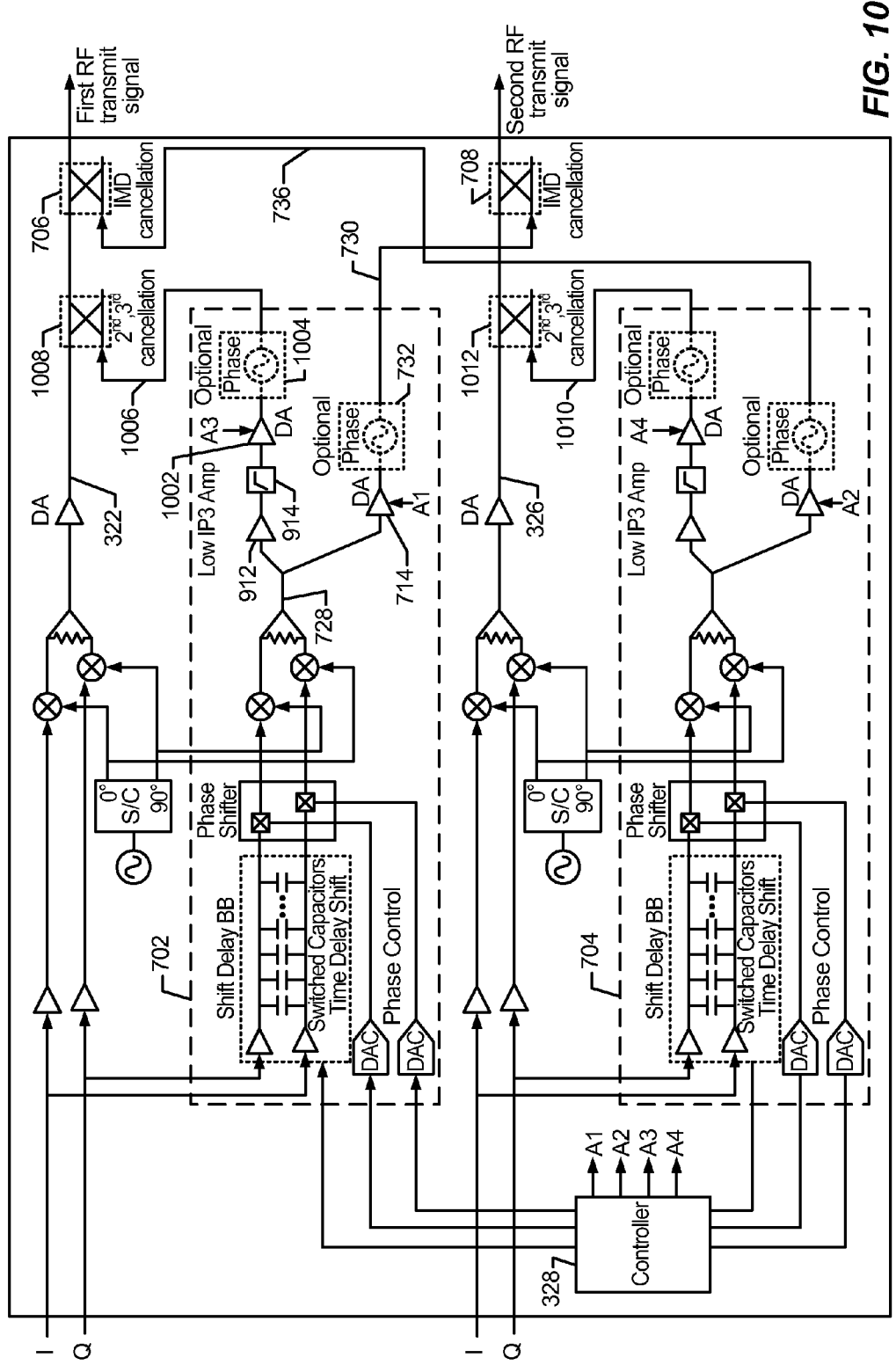
FIG. 10 shows a baseband to RF converter that includes an exemplary alternative embodiment of the IMD canceller of FIG. 9 for use in a wireless device.

FIG. 10 shows a baseband to RF converter that includes an exemplary alternative embodiment of the IMD canceller of FIG. 9 for use in a wireless device. In this embodiment, the canceller modules 702, 704 are modified to generate IM distortion canceling signals and harmonic canceling signals at the same time. The generated IM distortion canceling signals are cross-coupled to the first and second RF transmit signals. The harmonic distortion canceling signals are coupled back to the RF transmit signal associated with each canceller module.

As illustrated in the first canceller module 702 of FIG. 10, the delayed and phase adjusted cancellation signal 728 is input to two signal paths. A first signal path comprises DA 714 and optional phase shifter 732. The output of the DA 714 is an IM distortion canceling signal 730 that is connected to the directional coupler 708 to cancel any leakage of the first RF transmit signal 322 into the second RF transmit signal 326.

The second signal path that receives the delayed and phase adjusted cancellation signal 728 comprises the amplifier 912, the filter 914, DA 1002 and optional phase shifter 1004. The output of the DA 1002 is a harmonic canceling signal 1006 that is connected to the directional coupler 1008 to cancel harmonic distortion from the first RF transmit signal 322. The second canceller module 704 is configured identically to the first cancellation module 702. Thus, the canceller modules 702, 704 operate to generate both IM distortion canceling signals 730, 736 and harmonic distortion canceling signals 1006, 1010 and these signals are coupled to cancel leaking signals and harmonic distortion from the first RF transmit signal 322 and the second RF transmit signal 326 through the use of the couplers 706, 708, 1008, and 1012.

Figure 11:
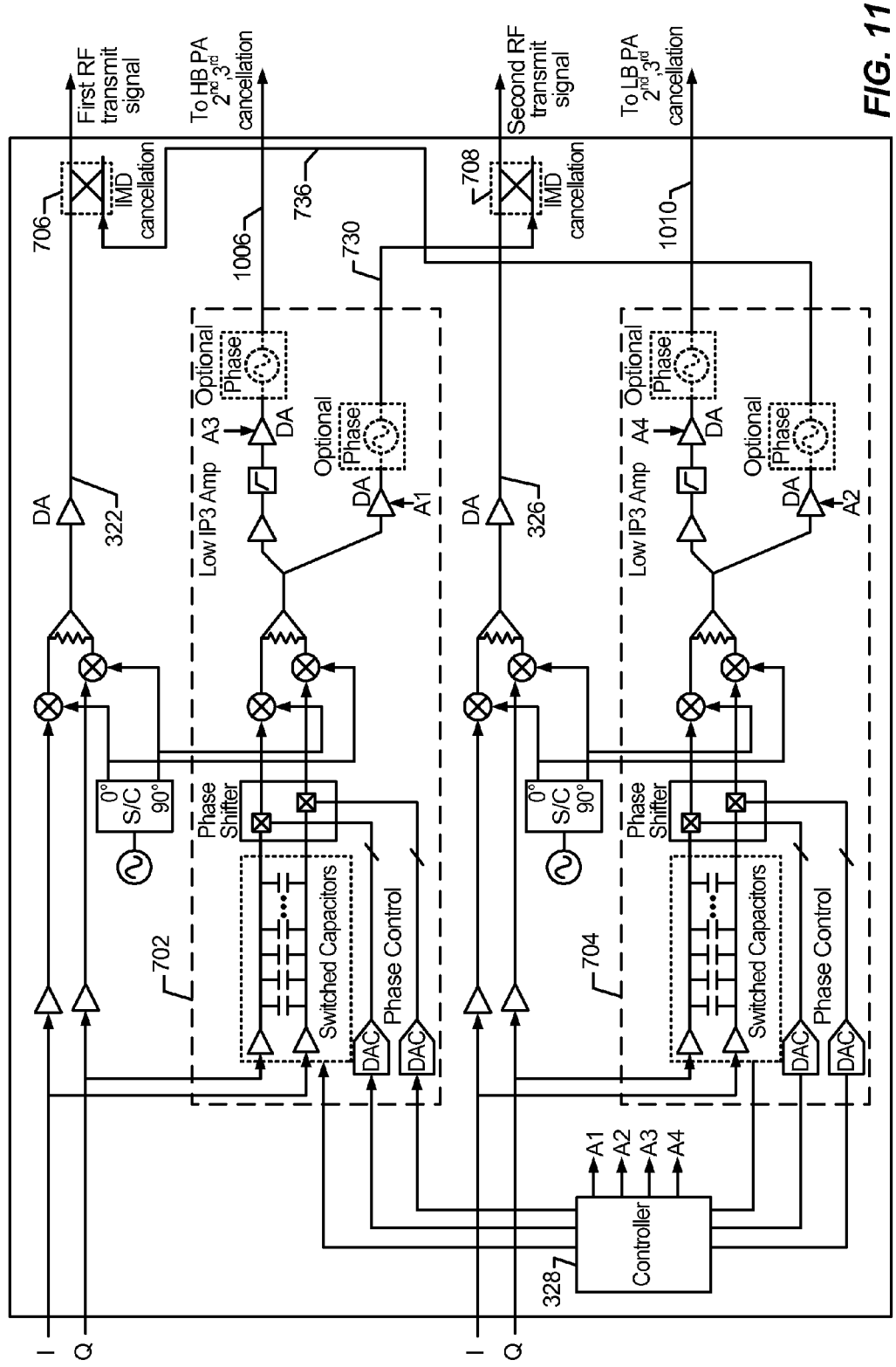
FIG. 11 shows a baseband to RF converter that includes an exemplary alternative embodiment of the IMD canceller of FIG. 10 for use in a wireless device.

FIG. 11 shows a baseband to RF converter that includes an exemplary alternative embodiment of the IMD canceller of FIG. 10 for use in a wireless device. In this exemplary embodiment, the canceller modules 702, 704 operate to generate IM distortion canceling signals 730, 736 and harmonic canceling signals 1006, 1010. The generated IM distortion canceling signals 730, 736 are cross-coupled to the first 322 and second 326 RF transmit signals. The harmonic distortion canceling signals generated from the canceller modules 702,

704 are output from the baseband to RF converter and coupled further down the transmission chain to cancel harmonic distortion.

Figure 12:
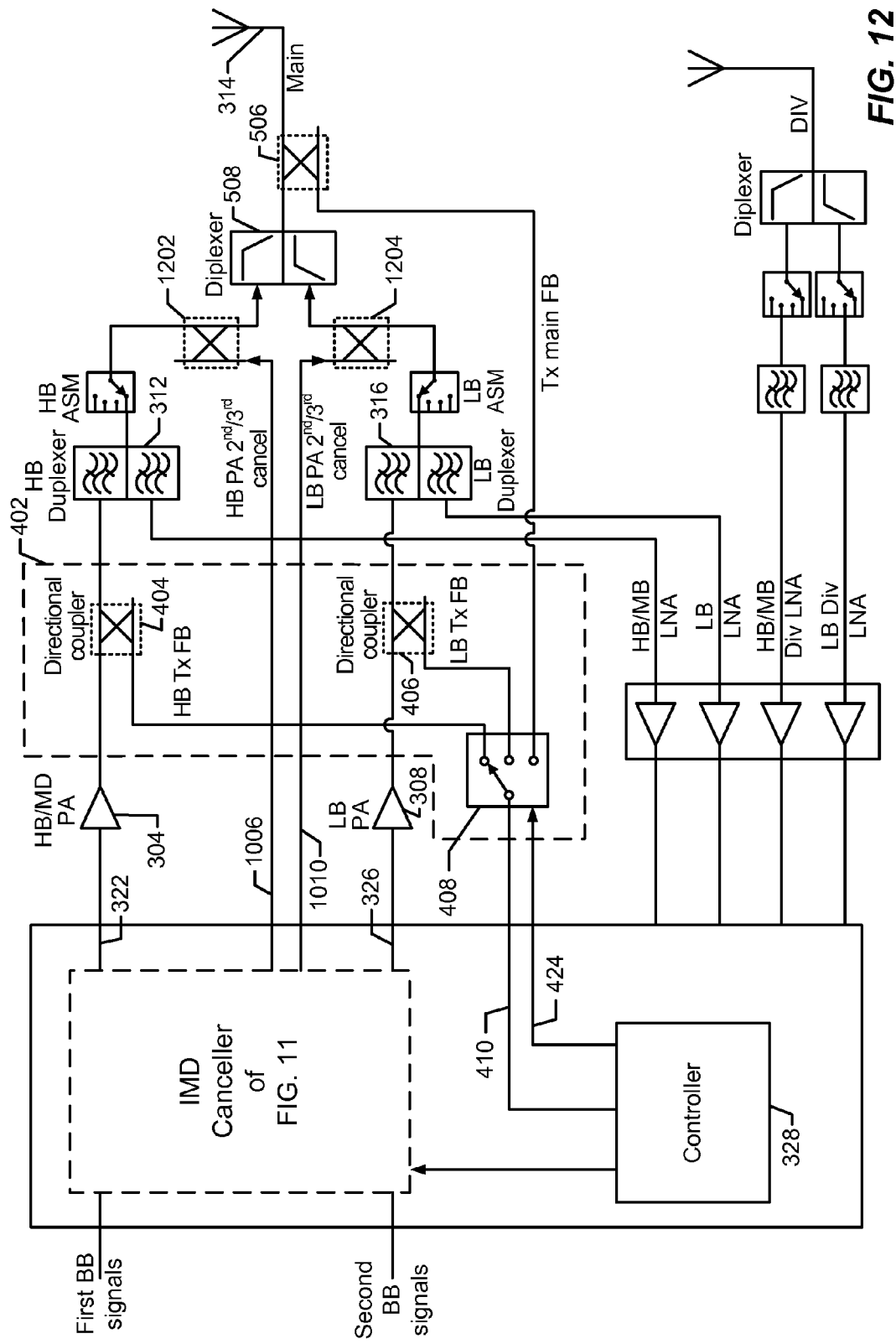
FIG. 12 shows a transmitter that includes an exemplary alternative embodiment of the IMD canceller of FIG. 11 for use in a wireless device.

FIG. 12 shows a transmitter that includes an exemplary alternative embodiment of the IMD canceller of FIG. 11 for use in a wireless device. In this exemplary alternative embodiment, the canceller modules 702, 704 shown in FIG. 11 are located within the IC of the baseband to RF converter 900. FIG. 12 also shows the coupling of the harmonic canceling signals 1006, 1010 to cancel harmonic distortion further down the transmission chain.

As shown in FIG. 12, the harmonic cancellation signals 1006, 1010, are output from the first and second canceller modules 702, 704 as shown in detail in FIG. 11 and are input to directional couplers 1202 and 1204. The directional couplers 1202, 1204 are coupled to signal paths that extend between the outputs of the duplexers 312, 316 and the inputs to the diplexer 508. By coupling the harmonic cancellation signals 1006, 1010 to the signal paths at this point in the transmission chain, the harmonic cancellation signals 1006, 1010 operate to cancel harmonic distortion at the inputs to the diplexer 508 just before transmission of the signals from the antenna 314.

The controller 328 operates to obtain one or more of the coupled signals obtained by the coupler 402 by controlling the operation of the switch 408. The controller 328 uses the coupled signals to control the operation of the cancellation module to generate the IMD canceling signals 730, 736 and the harmonic canceling signals 1006, 1010, which operate to reduce, minimize, or eliminate IMD and harmonic distortion from the transmitted RF signals.

Figure 13:
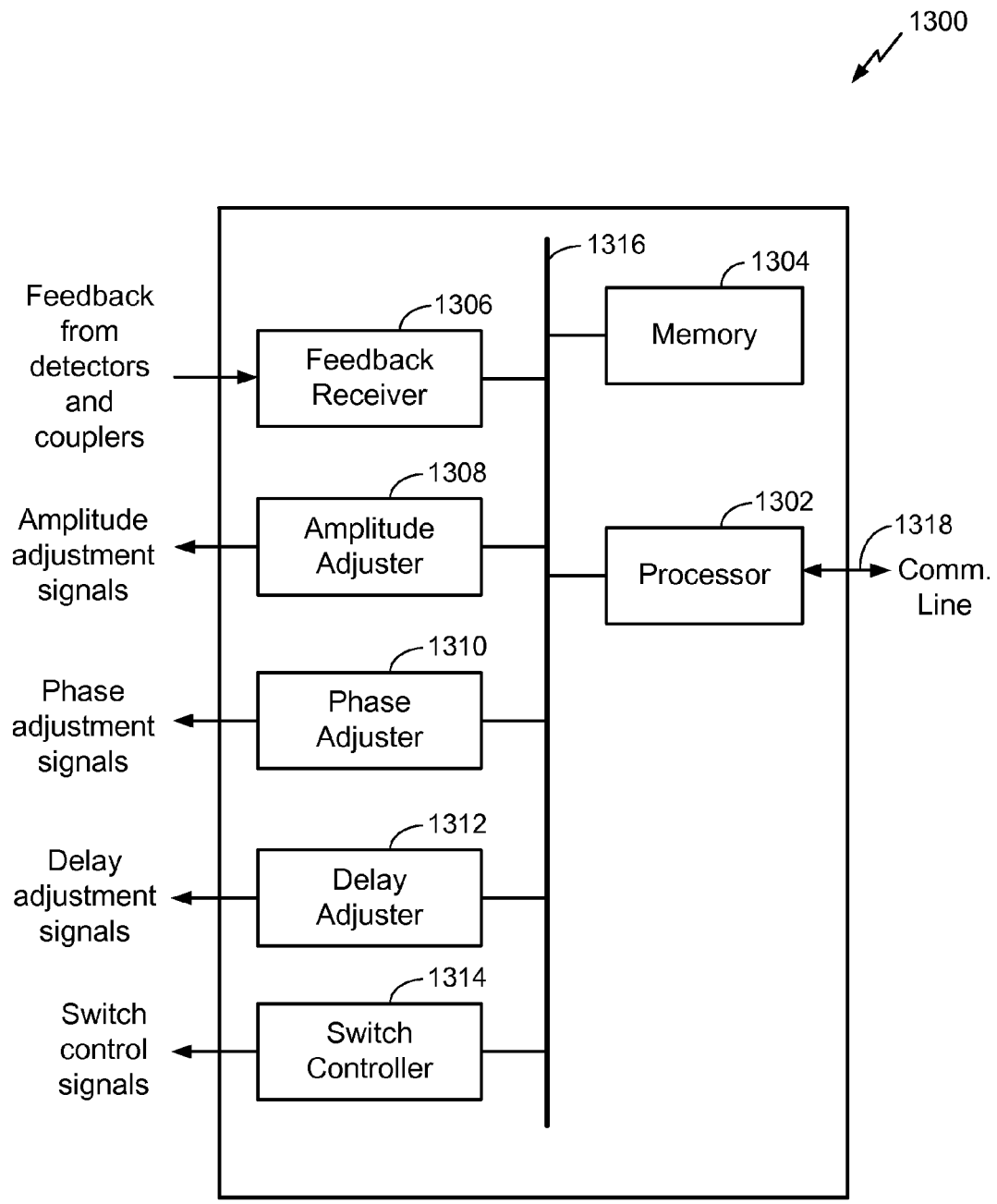
FIG. 13 shows an exemplary embodiment of a controller for use in an IMD canceller.

FIG. 13 shows an exemplary embodiment of a controller 1300 for use in an IMD canceller. For example, the controller 1300 is suitable for use as the controller 328 shown in FIG. 3. The controller 1300 comprises processor 1302, memory 1304, feedback receiver 1306, amplitude adjuster 1308, phase adjuster 1310, delay adjuster 1312, and switch controller 1314 all coupled to communicate over communication bus 1316.

The processor 1302 comprises at least one of a CPU, processor, gate array, hardware logic, discrete circuits, memory elements, and/or hardware executing software. The processor 1302 operates to control the other functional elements of the controller 1300 using the communication bus 1316. The processor 1302 is also configured to communicate with other entities at the wireless device using the communication line 1318. For example, the processor 1302 may receive instructions, control information, configuration information, data, measurements or other information over the communication line 1318.

The memory 1304 comprises any suitable memory or storage device that allows for storing, retrieving, and maintaining instructions and/or data associated with the operation of the controller 1300. In an exemplary embodiment, the memory 1304 stores algorithm instructions that can be executed by the processor 1302 to perform the functions of IMD and harmonic canceling as described herein.

The feedback receiver 1306 comprises hardware, such as amplifiers, buffers, registers, gates, analog to digital converters, digital to analog converters, or any other suitable hardware or discreet components and/or hardware executing software that operates to receive feedback signals from the signal couplers and power detectors in the various exemplary embodiments described above. The information received from the signal couplers and power detectors is input to the processor 1302 for processing and/or the memory 1304 for storage. For example, the feedback receiver 1306 operates to receive power detection signals from the detectors 396, 398 shown in FIG. 3 and converts these power detection signals to digital values that can be processed by the processor 1302 and/or stored in the memory 1304. In another example, the feedback receiver 1306 operates to receive coupled signals from the signal couplers 404, 406 shown in FIG. 4 and converts these coupled signals to digital values that can be processed by the processor 1302 and/or stored in the memory 1304. In an exemplary embodiment, the feedback receiver 1306 is configured to receive and process both analog and digital signals.

The amplitude adjustor 1308 comprises hardware, such as amplifiers, buffers, registers, gates, analog to digital converters, digital to analog converters or any other suitable hardware or discrete components and/or hardware executing software that operates to output amplitude adjustment signals to the adjustable amplifiers in the various exemplary embodiments described above. For example, the processor 1302 operates to determine amplitude adjustments to one or more of the adjustable amplifiers used in the various embodiments and passes these adjustments to the amplitude adjuster 1308. The amplitude adjuster 1308 outputs adjustment signals to the designated adjustable amplifiers to adjust their amplification factors according to the determinations made by the processor 1302. In an exemplary embodiment, the processor 1302 determines that the amplification factor of the first amplitude adjustment circuit 372 shown in FIG. 3 is to be changed to a new amplification factor. The processor 1302 sends the new amplification factor to the amplitude adjuster 1308 which outputs an amplitude adjustments signal through the signal line 380 to the first amplitude adjustment circuit 372 to set the new amplification factor. In an exemplary embodiment, the amplitude adjuster 1306 is configured to output both analog and digital adjustment signals.

The phase adjustor 1310 comprises hardware, such as amplifiers, buffers, registers, gates, analog to digital converters, digital to analog converters or any other suitable hardware or discrete components and/or hardware executing software that operates to output phase adjustment signals to the adjustable phase shifters in the various exemplary embodiments described above. For example, the processor 1302 operates to determine phase adjustments to one or more of the adjustable phase shifters used in the various embodiments and passes these adjustments to the phase adjuster 1310. The phase adjuster 1310 outputs phase adjustment signals to the designated adjustable phase shifters to adjust their phase shift according to the determinations made by the processor 1302. In an exemplary embodiment, the processor 1302 determines that the phase shift being provided by the first adjustable phase circuit 356 in FIG. 3 is to be changed to a new phase shift. The processor 1302 sends the new phase shift information to the phase adjuster 1310 which outputs a phase adjustment signal to the phase shifter 356 on line 368 to set the new phase shift. In an exemplary embodiment, the phase adjuster 1310 is configured to output both analog and digital phase adjustment signals.

The delay adjustor 1312 comprises hardware, such as amplifiers, buffers, registers, gates, analog to digital converters, digital to analog converters or any other suitable hardware or discrete components and/or hardware executing software that operates to output delay adjustment signals to the adjustable delay circuits in the various exemplary embodiments described above. For example, the processor 1302 operates to determine delay adjustments to one or more of the adjustable delay circuits used in the various embodiments and passes these adjustments to the delay adjuster 1312. The delay adjuster 1312 outputs delay adjustment signals to the designated adjustable delay circuits to adjust their delay setting according to the determinations made by the processor 1302. In an exemplary embodiment, the processor 1302 determines that the delay being provided by the first adjustable delay circuit 386 in FIG. 3 is to be changed to a new delay value. The processor 1302 sends the new delay value to the delay adjuster 1312 which outputs a delay adjustment signal to the delay circuit 386 through the line 392 to set the new delay value for that delay circuit. In an exemplary embodiment, the delay adjuster 1312 is configured to output both analog and digital delay adjustment signals.

The switch controller 1314 comprises hardware, such as amplifiers, buffers, registers, gates, analog to digital converters, digital to analog converters or any other suitable hardware or discrete components and/or hardware executing software that operates to output switch control signals to the switches used in the various exemplary embodiments described above. For example, the processor 1302 operates to determine switch settings for one or more of the switches used in the various embodiments and passes these switch settings to the switch controller 1314. The switch controller 1314 outputs switch control signals to the designated switches to adjust their switch settings according to the determinations made by the processor 1302. In an exemplary embodiment, the processor 1302 determines that the switch settings of the switch 408 in FIG. 4 are to be changed to a new switch setting. The processor 1302 sends the new switch setting to the switch controller 1314 which outputs a switch control signal to the switch 408 using the line 424 to set the new switch settings for that switch. In an exemplary embodiment, the switch controller 1312 is configured to output both analog and digital switch adjustment signals.

It should be noted that the controller 1300 represents just one implementation and that other implementations are possible. For example, the controller 1300 may be implemented in discrete logic that eliminates the need for a processor or memory devices. In another implementation, the functions and/or implementations of the controller 1300 are incorporated or integrated into the IC of the BB to RF converter 302.

Figure 14:
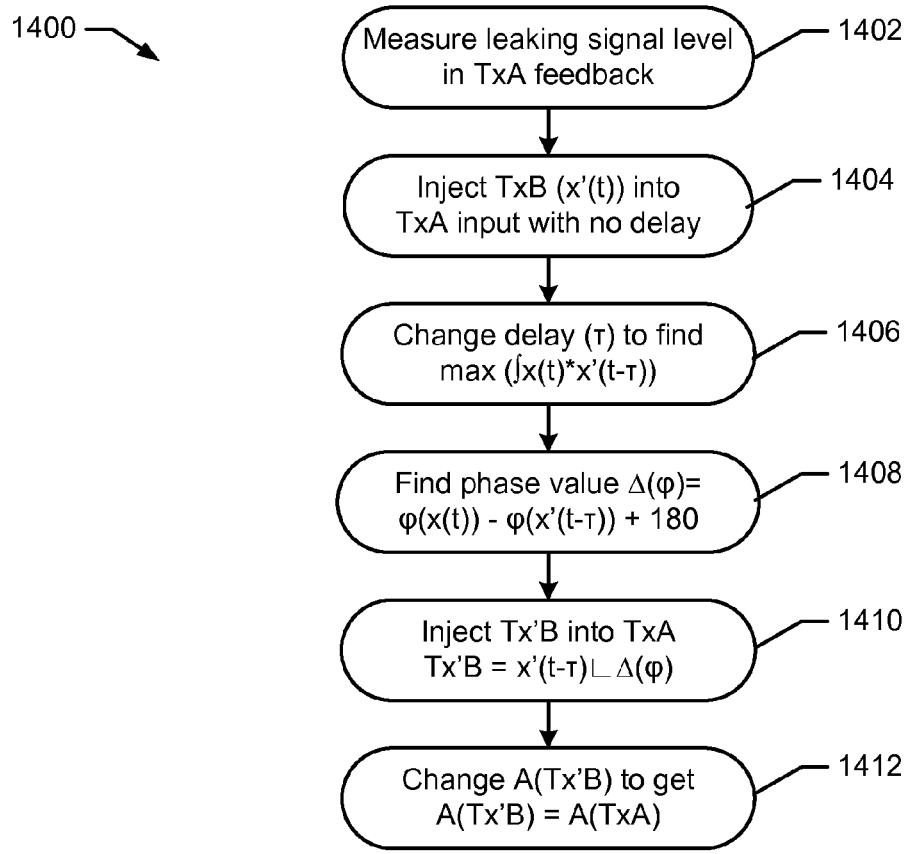
FIG. 14 shows exemplary operations for performing IMD cancellation in a wireless device.

FIG. 14 shows exemplary operations 1400 performed by an apparatus to provide calibration of leakage cancellation in a wireless device. For example, the operations 1400 are suitably performed by the canceller 338 shown in FIG. 3 to reduce, minimize, or eliminate leakage associated with the first (TxA) and second (TxB) transmit chains. In an exemplary embodiment, the processor 1302 executes instructions stored in the memory 1304 to control the components of the controller 1300 and the canceller 338 to perform the operations describe below.

At block 1402, measurement of a leakage signal level is taken while the first transmit chain TxA is on but not transmitting a specific signal (e.g., no signal input to DA 404). For example, an original signal (x(t)) is input to the second transmit chain TxB and appears on signal line 326 for transmission by PA2 308. The detector 396 measures a signal at the output of the PA1 304 while no signal being input for transmission by the first transmit chain TxA (e.g., no signal output by DA 404). Thus, the measured signal represents leakage from the second transmit chain (e.g., PA2 of TxB) into the first transmit chain (e.g., PA1 of TxA). In an exemplary embodiment, the feedback receiver 1306 at the controller 328 receives the measurement output from the detector 396 while disabling the operation of the canceller 338 by outputting the appropriate control signals to control the amplitude 1308, phase 1310, and delay 1312 adjusters to disable the operation of the canceller 338.

At block 1404, a signal (x'(t)) is injected into the first transmit chain TxA. The signal (x'(t)) is a coupled version of the original signal (x(t)) from the second transmit chain TxB and is injected into the first transmit chain TxA with no delay. In an exemplary embodiment, the controller 328 controls the phase 358, amplitude 374, and delay 386 adjustment circuits to obtain the coupled signal (x'(t)) from the second transmit chain TxB using coupler 344 and to couple that signal (without added delay) into the first transmit chain TxA using coupler 340. In an exemplary embodiment, the controller 328 uses the amplitude 1308, phase 1310, and delay 1312 adjusters to output the appropriate control signals to control the phase 358, amplitude 374, and delay 386 adjustment circuits to pass the coupled signal (x'(t)) without adding any delay so that it can be injected into the first transmit chain TxA by the coupler 340.

At block 1406, a delay sweep is performed to change a delay parameter (τ) to find maximum correlation between the original signal (x(t)) and a delayed version of the injected signal x' (t−τ) as detected by the detector 396. For example, the controller processor 1302 controls the delay adjuster 1312 to output control signals to control the delay adjustment circuit 386 to sweep a delay associated with the injected coupled signal x'(t−τ). The detector 396 then feedbacks the detected signal to the feedback receiver 1306. Knowing the original signal (x(t)), the processor 1302 is able to find the maximum correlation by performing a convolution between the original signal x(t) and the injected signal x'(t−τ), which is [max (∫x(t)*x'(t−τ))]. The delay value τ' is then determined that provides the maximum correlation.

At block 1408, a phase difference is determined that can be used for cancellation of the leakage signal. For example, the phase difference Δ(φ) between the phase of the original signal φ(x(t)) and the phase of the appropriately delayed injected signal φ(x'(t−τ')) is determined. [e.g., Δ(φ)=φ(x(t))−φ(x'(t−τ'))] In an exemplary embodiment, the processor 1302 determines this phase difference. Once Δ(φ) is determined, it is possible to add 180° find the phase setting for cancellation [e.g., Δ(φ)'=Δ(φ)+180].

At block 1410, the injected signal is adjusted for the determined delay and phase. In an exemplary embodiment, the processor 1302 controls the delay 1312 and phase 1310 adjusters to output control signals to the delay 386 and phase 358 adjustment circuits to set the delay and phase of the injected signal to the determined values. The signal injected into the TxA chain then becomes [x'(t−τ')|_ Δ(φ)'].

At block 1412, the amplitude of the injected signal is adjusted for maximum cancellation. In an exemplary embodiment, the processor 1302 controls the amplitude adjuster 1308 to output control signals to control the amplitude adjustment circuit 374 to set the amplitude (A') of the injected signal to obtain maximum cancellation. The signal injected into the TxA chain then becomes [A'(x'(t−τ')|_ Δ(φ)')].

Thus, the controller 1300 and the canceller 338 are configured to perform the operations 1400 to calibrate the cancellation of a leakage signal from a first transmit chain to a second transmit chain. The controller 1300 and the canceller 338 are also configured to perform operations 1400 in a similar fashion to calibrate the cancellation of a leakage signal from the second transmit chain to the first transmit chain. It should be noted that that operations 1400 are just one implementation and that changes, additions, modifications, and/or rearrangements of the operations are within the scope of the exemplary embodiments.

Figure 15:
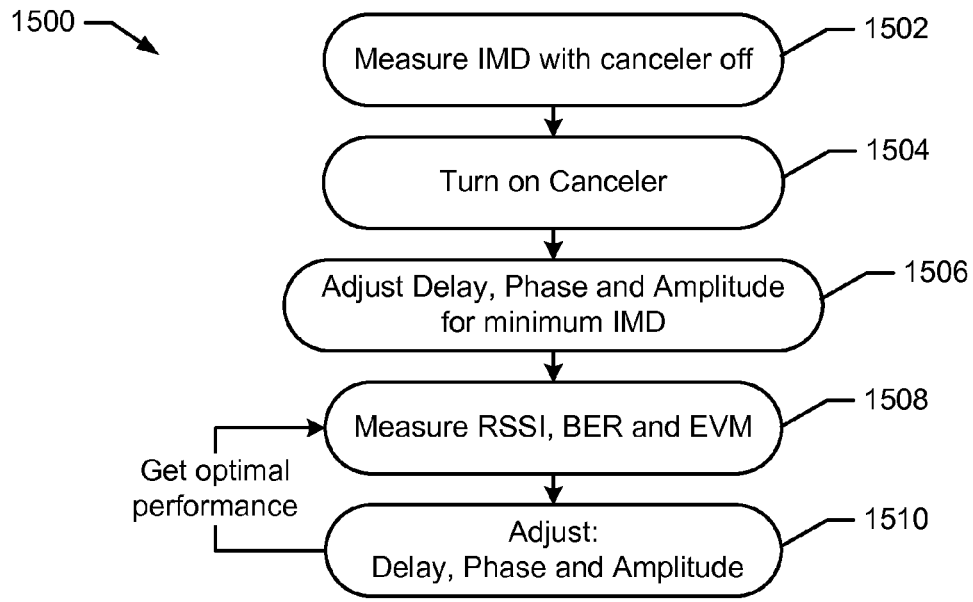
FIG. 15 shows exemplary operations for performing IMD cancellation in a wireless device.

FIG. 15 shows exemplary operations 1500 performed by an apparatus to provide calibration of IMD cancellation in a wireless device. For example, the operations 1500 are suitably performed by the canceller 338 shown in FIG. 3. In an exemplary embodiment, the processor 1302 execute instructions stored in the memory 1304 to control the components of the controller 1300 and the canceller 338 to perform the operations describe below.

At block 1502, IMD is measured with respect to the first and second transmit chains. In an exemplary embodiment, IMD is measured by a device processor, such as a modem, that computes the IMD and provides the measurements to the controller 1300 using the communication line 1318. The canceller 338 is turned off and both Tx chains are turned on. Assuming that IMD appears in the RxA band, it can be detected in the RxA receive band by the baseband to RF converter 302 and the IMD level is fed into the processor 1302 of the controller 1300 using the communication line 1318.

At block 1504, the IMD canceller 338 is turned on. In an exemplary embodiment, the controller 1300 enables the IMD canceller 338 with the calibrated parameters for phase delay and amplitude determined by the operations 1400.

At block 1506, adjustments are made to the delay, phase and amplitude of the IMD to obtain reduced or minimum IMD. In an exemplary embodiment, the processor 1302 controls the amplitude 1308, phase 1310 and delay 1312 adjusters to output control signals to fine tune the delay, phase and amplitude adjustment circuits of the IMD 338, if needed, in order to obtain reduced or minimum IMD. Measurements of IMD are input to the processor 1302 from the baseband to RF converter 302 to make this determination.

At block 1508, measurement of additional Rx performance characteristics are made. For example, measurements of one or more of signal strength (RSSI), error rate (BER) and/or error vector magnitude (EVM) are made in order to measure the Rx channel desense.

At block 1510, adjustments are made to the delay, phase and amplitude of the canceller 338 to obtain the best performance characteristics with minimum Rx desense. In an exemplary embodiment, the processor 1302 controls the amplitude 1308, phase 1310 and delay 1312 adjusters to output control signals to fine tune the delay, phase and amplitude adjustment circuits of the canceller 338, if needed, in order to reach the best or desired performance characteristics with minimum Rx desense. Measurements are input to the processor 1302 from the baseband to RF converter 302 to make this determination.

Thus, the controller 1300 and the canceller 338 are configured to perform the operations 1500 to calibrate the canceller 338 to obtain the best receiver performance. It should be noted that that operations 1500 are just one implementation and that changes, additions, modifications, and/or rearrangements of the operations are within the scope of the exemplary embodiments.

Figure 16:
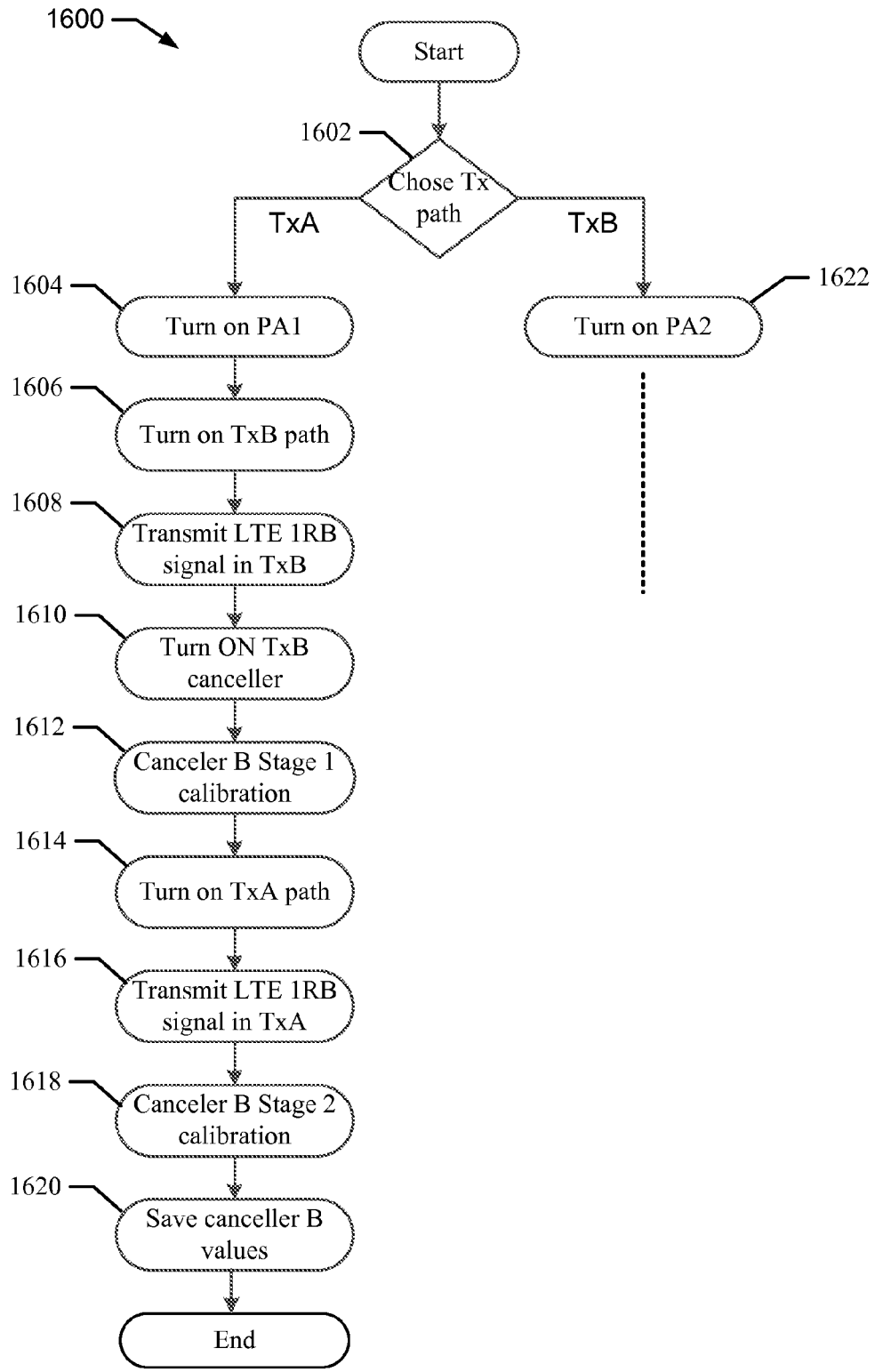
FIG. 16 shows exemplary operations for performing dual IMD cancellation in a wireless device.

FIG. 16 shows exemplary operations 1600 performed by an apparatus to provide a dual interference canceller calibration procedure in a wireless device. For example, the operations 1600 are suitable performed by canceller 338 shown in FIG. 3. In an exemplary embodiment, the processor 1302 execute instructions stored in the memory 1304 to control the components of the controller 1300 and the canceller 338 to perform the operations describe below.

At block 1602, a Tx chain is chosen for calibration. In this example, the first Tx1 chain having PA1 304 is chosen.

At block 1604, the power amplifier on the chosen Tx path is turned on. In this example, the PA1 304 is turned on so the leakage from the other Tx chain (Tx2) can pass through when Tx1 is not transmitting. In an exemplary embodiment, the baseband to RF converter 302 controls the operation of the transmit chains and the power amplifiers on those chains to perform this operation.

At block 1606, the second Tx chain is turned on. In this example, Tx2 and PA2 are turned on in order to measure the leakage passing through PA1.

At block 1608, a signal is transmitted on the Tx2 chain. For example, a LTE 1RB signal (or any other signal) is transmitted on the Tx2 chain for calibrating the Tx2 canceller.

At block 1610, the Tx2 chain canceller is turned on for calibration. For example, the controller 1300 controls the amplitude 1308, phase 1310, and delay 1312 adjusters to output control signals to enable the amplitude 374, phase 358, and delay 386 adjustment circuits so that a $2^{nd}$ cancellation signal 390 can be generated.

At block 1612, the calibration operations 1400 disclosed above are performed. By performing the operations 1400, calibrated amplitude, phase and delay parameters can be determined which allow the $2^{nd}$ cancellation signal 390 to be generated to reduce, minimize or eliminate leakage of Tx2 signals into Tx1.

At block 1614, the Tx1 chain is turned on to allow signals to be transmitted by the Tx1 chain. Turning on the Tx1 chain allows IMD products to be seen at the PA1 304 output.

At block 1616, a signal is transmitted on the Tx1 chain. For example, a LTE 1RB signal (or any other signal) is transmitted on the Tx1 chain so that IMD products will be generated at PA1 output.

At block 1618, the calibration operations 1500 disclosed above are performed. By performing the operations 1500, calibrated amplitude, phase and delay parameters can be determined to generate the $2^{nd}$ cancellation signal 390 in order to reach the best or desired performance characteristics (e.g., RSSI, BER, EVM, etc.) with minimum Rx desense.

At block 1620, the amplitude, phase, and delay values determined from the operations 1400 and 1500 are saved. For example, the processor 1302 saves the amplitude, phase, and delay values in the memory 1304. The processor 1302 also controls the amplitude 1308, phase 1310, and delay 1312 adjusters to use the saved values to generate the appropriate cancellation signal during operation of the transmitter.

At block 1622, the operations as performed in blocks 1604-1620 are performed to calibrate the other Tx channel. Those calibrated amplitude, phase, and delay values associated with the other Tx channel are then saved.

Thus, the controller 1300 and the canceller 338 are configured to perform the operations 1600 to perform a dual interference canceller calibration procedure to obtain improved receiver performance. It should be noted that that operations 1600 are just one implementation and that changes, additions, modifications, and/or rearrangements of the operations are within the scope of the exemplary embodiments.

It should also be noted that the operations 1400, 1500 and 1600 can be performed by any of the exemplary embodiments shown. For example, the operation of the detectors 396 and 398 shown in FIG. 3 can be performed by the various signal couplers shown in FIGS. 4-12. Thus, the operations 1400, 1500, and 1600 performed by the controller 1300 and the canceller 338 perform canceller calibration procedures utilizing the canceller 338 to obtain the best or improved receiver performance. It should also be noted that the operations 1400, 1500, and 1600 can be performed in the digital domain by the apparatus shown and described with reference to FIGS. 19-20.

Figure 17:
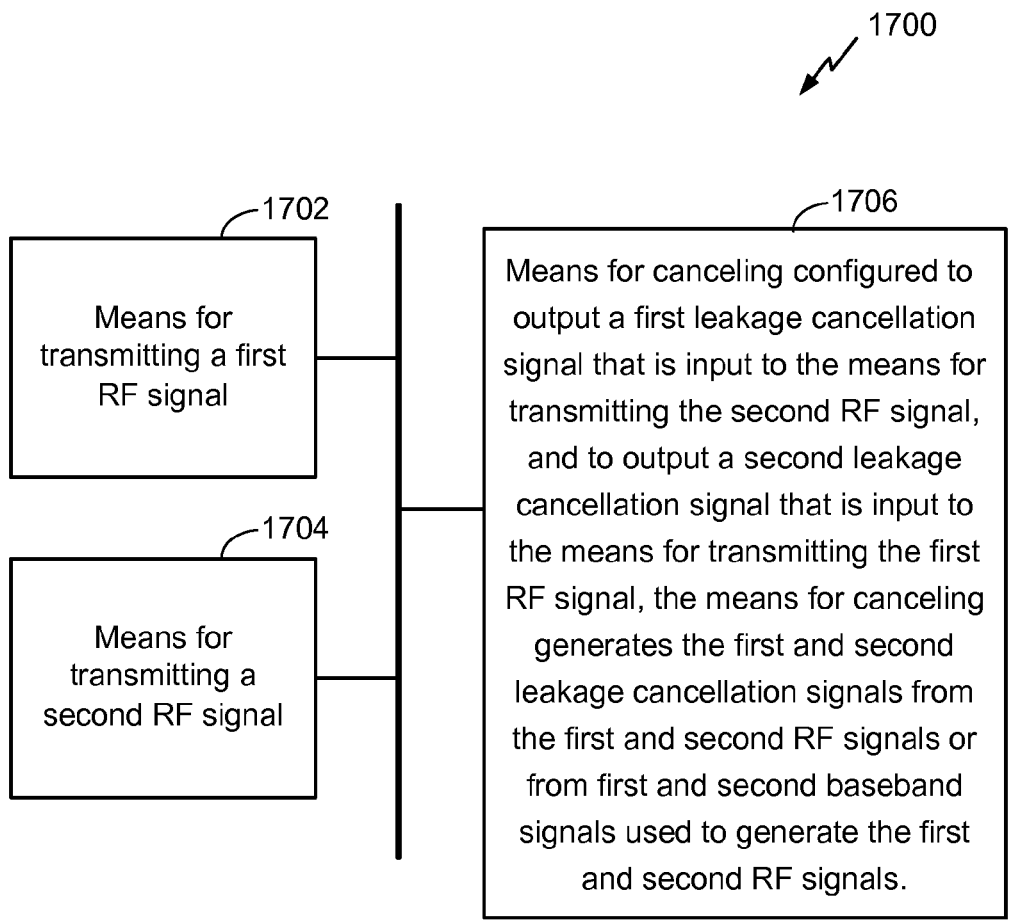
FIG. 17 shows an exemplary apparatus configured for IMD cancellation in a wireless device.

FIG. 17 shows an exemplary apparatus 1700 configured for IMD cancellation in a wireless device. For example, the apparatus 1700 is suitable for use as the canceller 338 shown in FIG. 3. The apparatus 1700 comprises a first means (1702) for transmitting a first RF signal, which in an exemplary embodiment comprises the first transmit chain shown in FIG. 3. The apparatus 1700 comprises a second means (1704) for transmitting a second RF signal, which in an exemplary embodiment comprises the second transmit chain shown in FIG. 3. The apparatus 1700 comprises a third means (1706) for canceling configured to output a first leakage cancellation signal that is input to the means for transmitting the second RF signal, and to output a second leakage cancellation signal that is input to the means for transmitting the first RF signal, the means for canceling generates the first and second leakage cancellation signals from the first and second RF signals or from first and second baseband signals used to generate the first and second RF signals, which in an exemplary embodiment comprises the canceller 338 shown in FIG. 3.

Figure 18:
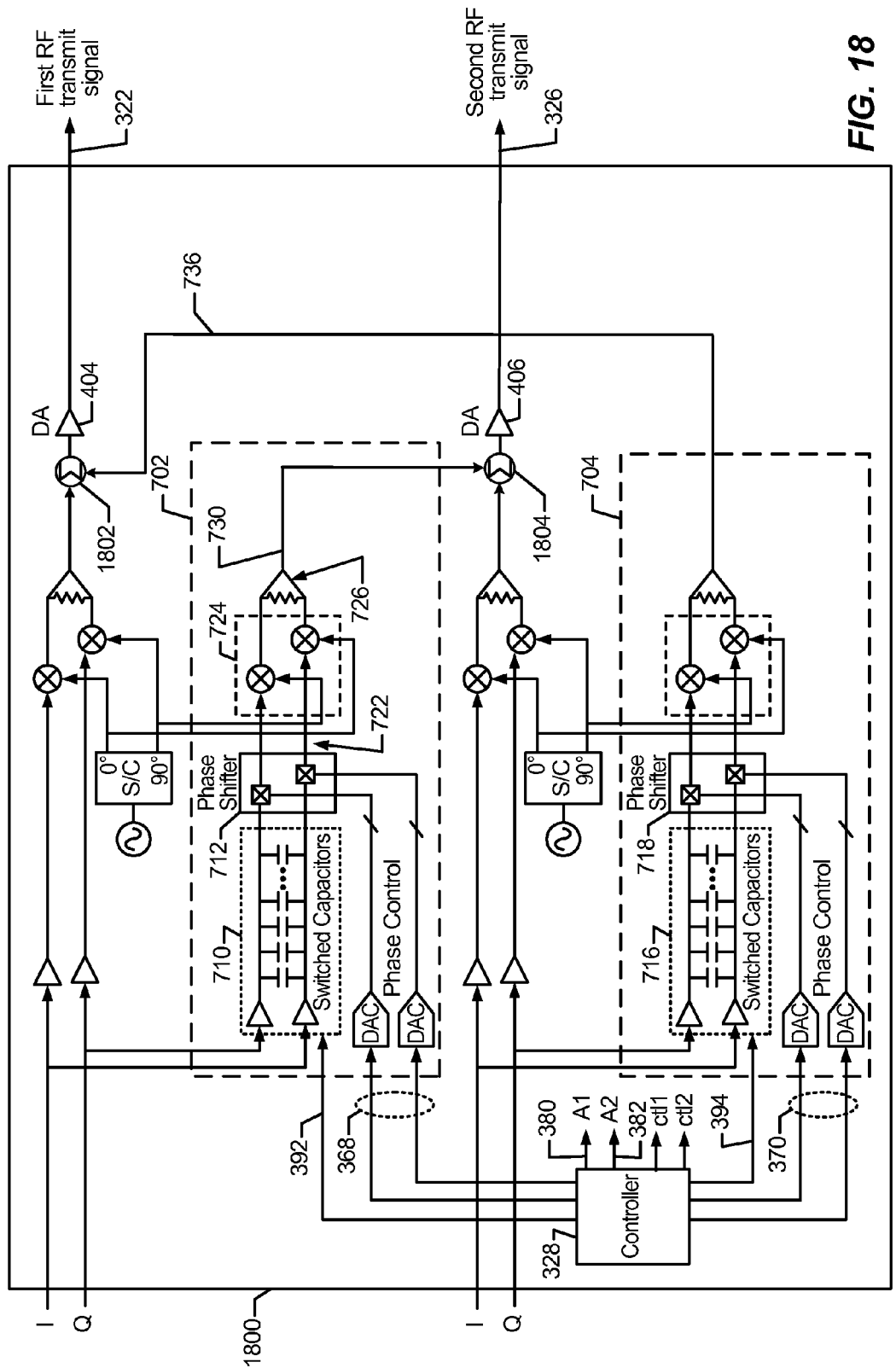
FIG. 18 shows a modified baseband to RF converter comprising an exemplary embodiment of an IMD canceller for use in a wireless device.

FIG. 18 shows a modified baseband to RF converter 1800 comprising an exemplary embodiment of an IMD canceller for use in a wireless device. For example, the modified baseband to RF converter 1800 is a modified version of the baseband to RF converter 700 shown in FIG. 7. In this exemplary embodiment, distortion cancelling signals are generated from received baseband signals and applied to the generated RF signals that are output from the modified baseband to RF converter 1800.

As illustrated in FIG. 18, the first 702 and second 704 cancellation modules are configured as shown in FIG. 7 and operate as described above. For example, the first cancellation module 702 outputs cancellation signal 730 and the second cancellation module 704 outputs cancellation signal 736, as described with reference to FIG. 7.

As shown in FIG. 18, the modified baseband to RF converter 1800 includes signal combiners 1802 and 1804 that operate to combine signals at their inputs to generate combined signals at their outputs.

During operation, the controller 328 uses received feedback signals (not shown in FIG. 18 but shown in FIG. 8) to adjust the cancellation modules 702, 704 to generate the first and second cancellation signals 730, 736. The signal combiners 1802 and 1804 operate to combine the cancellation signals 730 and 736 with the first and second RF transmit signals prior to the DAs 404 and 406. The DAs 404 and 406 then receive, as inputs, the RF transmit signals that have been adjusted to reduce, minimize or eliminate IMD. The DAs 404 and 406 then output the amplified adjusted RF transmit signals 322 and 326. As a result of the operation of the modified baseband to RF converter 1800, IMD products between the first and second channels are reduced, minimized or eliminated.

Figure 19:
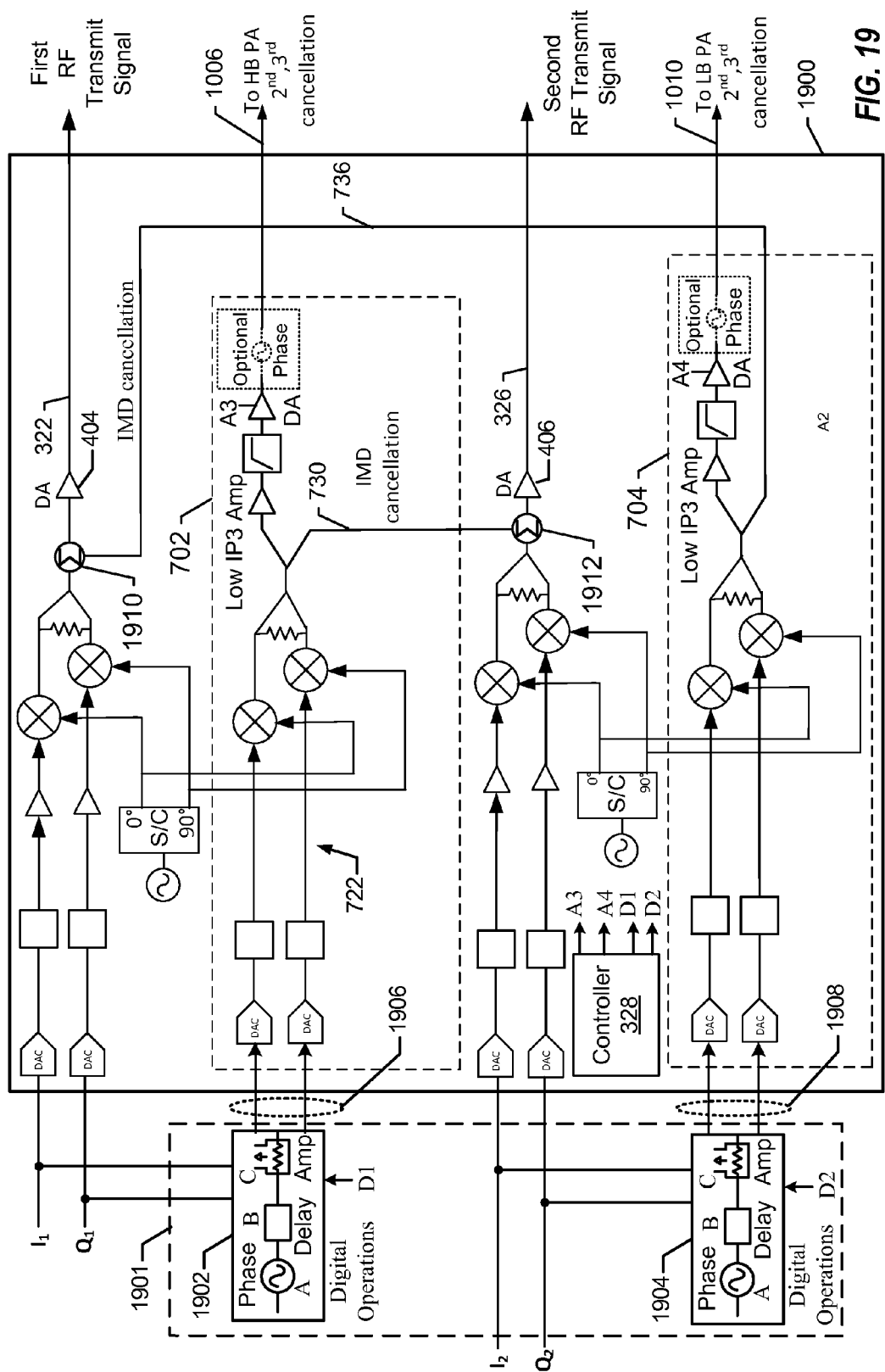
FIG. 19 shows a modified baseband to RF converter comprising an exemplary alternative embodiment of an IMD canceller for use in a wireless device.

FIG. 19 shows a modified baseband to RF converter 1900 comprising an exemplary embodiment of an IMD canceller for use in a wireless device. For example, the modified baseband to RF converter 1900 is a modified version of the baseband to RF converter shown in FIG. 11. In this exemplary embodiment, a digital leakage canceller 1901 operates to generate digital distortion cancelling signals 1906 and 1908 from digital baseband signals ($I_1$, $Q_1$/$I_2$, $Q_2$). The digital distortion cancelling signals 1906 and 1908 are used to generate RF transmit signals that are output from the modified baseband to RF converter 1900.

As illustrated in FIG. 19, the digital leakage canceller 1901 comprises a first digital canceller 1902 and a second digital canceller 1904. In an exemplary embodiment, the digital leakage canceller 1901 is located in a baseband processor, modem, or other entity in the wireless device where digital baseband signals can be processed. The first digital canceller 1902 receives the first ($I_1 \cdot Q_1$) signals and performs the operations described above (e.g., See FIG. 7) in a digital domain to generate the digital cancellation signals 1906. The digital calibration signals 1906 are converted to analog signals that are analogous to the analog signals 722 shown in FIG. 7. In an exemplary embodiment, the controller 328 outputs digital control signals (D1) which control the operation of the canceller 1902 to adjust digital phase (A), digital delay (B) and digital amplitude (C) adjustors to generate the digital cancellation signals 1906. In an exemplary embodiment, the controller 328 outputs the digital controls signals D1 based on feedback received from further down the transmit chain during the operation of a calibration procedure, such as described in the operations 1400, 1500, and 1600. The second digital canceller 1904 operates similarly to the first digital canceller 1902 to generate the second cancellation signals 1908 based on control signal D2.

The first 702 and second 704 cancellation modules are configured as shown in FIG. 11 and operate as described above. For example, the first cancellation module 702 outputs cancellation signal 730 and the second cancellation module 704 outputs cancellation signal 736, as described with reference to FIG. 11.

As shown in FIG. 19, the modified baseband to RF converter 1900 includes signal combiners 1910 and 1912 that operate to combine signals at their inputs to generate combined signals at their outputs.

During operation, the controller 328 uses received feedback signals (not shown in FIG. 19 but shown in FIG. 8) to adjust the cancellation modules 702, 704 to generate the first and second cancellation signals 730, 736. The signal combiners 1910 and 1912 operate to combine the cancellation signals 730 and 736 with the first and second RF transmit signals prior to the DAs 404 and 406. The DAs 404 and 406 then receive, as inputs, the RF transmit signals that have been adjusted to reduce, minimize or eliminate IMD. The DAs 404 and 406 then output the adjusted amplified RF transmit signals 322 and 326. As a result of the operation of the modified baseband to RF converter 1900, IMD products between the first and second channels are reduced, minimized or eliminated. The modified baseband to RF converter 1900 also provides the generation of the cancellation signals in a digital process with can be integrated into a baseband processor, modem, or other device to save circuit area.

FIG. 20 shows a modified baseband to RF converter 2000 comprising an exemplary embodiment of an IMD canceller for use in a wireless device. For example, the modified baseband to RF converter 2000 is a modified version of the baseband to RF converter shown in FIG. 19. In this exemplary embodiment, the digital leakage canceller 1901 operates to generate digital distortion cancelling signals 1906 and 1908 from digital baseband signals ($I_1$, $Q_1$/$I_2$, $Q_2$). The digital distortion cancelling signals 1906 and 1908 are used to generate RF transmit signals that are output from the modified baseband to RF converter 2000.

As illustrated in FIG. 20, a switching circuit 2001 is provided that operates to switch between the cancellation signals 1906 and 1908 to save circuit area. For example the switching circuit 2001 comprises switch 2002, switch 2004 and switch 2006. The controller 328 outputs switch control signals (se11, se12, and se13) which control the operation of the switches 2002, 2004, 2006 to connect various input terminals to various output terminals of the switches. For example, the switch 2002 switches its output between the first 1906 and second 1908 cancellation signals received by the switch 2002 based on the (se11) control signal. The switch 2004 switches its output between the first and second LO signals based on the (se12) control signal. The outputs of the switches 2002 and 2004 are input to the oscillators shown generally at 2010. The switch 2006 switches its input terminal to one of two output terminals based on the (se13) control signal. Thus, when the cancellation signal 736 is being generated, the switches 2002 and 2004 are controlled to select the second cancellation signals 1908 and second LO, and the switch 2006 is controlled to connect its input terminal to the output terminal that is connected to the signal combiner 1910. When the cancellation signal 730 is being generated, the switches 2002 and 2004 are controlled to select the first cancellation signals 1906 and first LO, and the switch 2006 is controlled to connect its input terminal to the output terminal that is connected to the signal combiner 1912.

As shown in FIG. 20, the modified baseband to RF converter 2000 includes signal combiners 1910 and 1912 that operate to combine signals at their inputs to generate combined signals at their outputs.

During operation, the signal combiners 1910 and 1912 operate to selectively combine one of the cancellation signals 730 and 736 with the first or second RF transmit signals prior to the DAs 404 and 406 based on the operation of the switches 2002, 2004, and 2006. The DAs 404 and 406 then receive, as inputs, the RF transmit signals that have been adjusted to reduce, minimize or eliminate IMD. The DAs 404 and 406 then output the adjusted amplified RF transmit signals 322 and 326. As a result of the operation of the modified baseband to RF converter 2000, IMD products between the first and second channels are reduced, minimized or eliminated. The modified baseband to RF converter 2000 also provides the generation of the cancellation signals in a digital process with can be integrated into a baseband processor, modem, or other device to save circuit area.

The exemplary embodiments of an IMD canceller described herein may be implemented on an IC, an analog IC, an RFIC, a mixed-signal IC, an ASIC, a printed circuit board (PCB), an electronic device, etc. The IMD canceller may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an IMD canceller described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein the disclosure is to be accorded the widest scope consistent with the principles and novel features disclosed herein.

What is claimed is:

1. An apparatus comprising:
 a first transmit chain configured to transmit a first RF signal;
 a second transmit chain configured to transmit a second RF signal; and
 a canceller configured to output a first leakage cancellation signal that is input to the second transmit chain, and to output a second leakage cancellation signal that is input to the first transmit chain, the canceller generates the first and second leakage cancellation signals from the first and second RF signals or from first and second baseband signals used to generate the first and second RF signals.

2. The apparatus of claim 1, the first transmit chain includes a first amplifier and the second cancellation signal is input to the first amplifier, and the second transmit chain includes a second amplifier and the first cancellation signal is input to the second amplifier.

3. The apparatus of claim 1, further comprising a feedback receiver that receives first and second feedback signals, the first feedback signal indicates a level of leakage of the second RF signal to the first transmit chain and the second feedback signal indicates a level of leakage of the first RF signal to the second transmit chain.

4. The apparatus of claim 3, the first and second feedback signals determined from at least one of a power amplifier input, a power amplifier output, a diplexer input and an antenna input associated with the first and second transmit chains.

5. The apparatus of claim 3, further comprising a controller configured to adjust at least one of amplitude, phase, and time delay of the first and second leakage cancellation signals.

6. The apparatus of claim 5, the controller configured to adjust at least one of the amplitude, phase, and time delay of at least one of the first and second leakage cancellation signals based on the indicated levels of leakage.

7. The apparatus of claim 5, the controller configured to adjust at least one of the amplitude, phase, and time delay of at least one of the first and second leakage cancellation signals based on a measure of intermodulation distortion (IMD).

8. The apparatus of claim 5, the controller configured to adjust at least one of the amplitude, phase, and time delay of at least one of the first and second leakage cancellation signals based on a transceiver performance measurement.

9. The apparatus of claim 1, the canceller configured to output a first harmonic distortion cancellation signal that is coupled to the first transmit chain, and to output a second harmonic distortion cancellation signal that is coupled to the second transmit chain.

10. The apparatus of claim 1, the apparatus integrated within a baseband to RF integrated circuit (IC) of a transmitter.

11. The apparatus of claim 1, further comprising:
first and second signal combiners that combine the first and second cancellation signals with first and second upconverted RF signals to produce first and second adjusted RF signals, respectively; and
first and second driver amplifiers that amplify the first and second adjusted RF signals to produce the first and second RF signals.

12. The apparatus of claim 11, further comprising a switching circuit configured to selectively connect the first cancellation signal to one of the first and second signal combiners and to selectively connect the second cancellation signal to one of the first and second signal combiners.

13. The apparatus of claim 11, the canceller configured to output first digital cancellation signals that are converted to the first leakage cancellation signal, to output second digital cancellation signals that are converted to the second leakage cancellation signal, and to generate the first and second digital cancellation signals from first and second digital baseband signals used to produce the first and second RF signals.

14. The apparatus of claim 13, the further comprising a controller configured to output control signals to digitally adjust at least one of amplitude, phase, and time delay of the first and second digital cancellation signals based on at least one feedback signal.

15. The apparatus of claim 1, further comprising a controller coupled to the canceller, the controller configured to measure a leakage signal in the first transmit chain, the leakage signal associated with the second RF signal flowing in the second transmit chain, and to control the canceller to inject a coupled signal into the first transmit chain, the coupled signal being a coupled version of the second RF signal.

16. The apparatus of claim 15, the controller configured to sweep a delay parameter to find a delay value that yields a selected correlation between the second RF signal and the injected coupled signal delayed by the delay value, to determine a phase difference between the second RF signal and the injected coupled signal delayed by the delay value, and to determine a phase adjustment based on the phase difference.

17. The apparatus of claim 16, the controller configured to adjust the injected signal using the delay value and the phase adjustment to produce a phase and delay adjusted injected signal, and to adjust an amplitude level of the phase and delay adjusted injected signal to produce the second leakage cancellation signal.

18. The apparatus of claim 1, further comprising a controller coupled to the canceller, the controller configured to determine an intermodulation distortion (IMD) level with respect to first and second transmit chains, and to control the canceller to adjust at least one of delay, phase, and amplitude of at least one of the first and second leakage cancellation signals to reduce the IMD level.

19. The apparatus of claim 18, the controller configured to determine at least one receiver (Rx) performance characteristic selected from a set that includes signal strength (RSSI), bit error rate (BER) and error vector magnitude (EVM) levels, and to adjust at least one of the delay, the phase, and the amplitude of the at least one of the first and second leakage cancellation signals to obtain a desired level of the at least one Rx performance characteristic.

20. An apparatus comprising:
means for transmitting a first RF signal;
means for transmitting a second RF signal; and
means for canceling configured to output a first leakage cancellation signal that is input to the means for transmitting the second RF signal, and to output a second leakage cancellation signal that is input to the means for transmitting the first RF signal, the means for canceling generates the first and second leakage cancellation signals from the first and second RF signals or from first and second baseband signals used to generate the first and second RF signals.

* * * * *